(12) United States Patent
Cronin et al.

(10) Patent No.: US 9,318,693 B2
(45) Date of Patent: Apr. 19, 2016

(54) METHOD FOR FABRICATING A DAMASCENE SELF-ALIGNED FERROELECTRIC RANDOM ACCESS MEMORY (F-RAM) HAVING A FERROELECTRIC CAPACITOR ALIGNED WITH A THREE DIMENSIONAL TRANSISTOR STRUCTURE

(71) Applicant: CYPRESS SEMICONDUCTOR CORPORATION, San Jose, CA (US)

(72) Inventors: John Cronin, Jericho, VT (US); Shan Sun, Monument, CO (US); Thomas Davenport, Denver, CO (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 81 days.

(21) Appl. No.: 14/010,174

(22) Filed: Aug. 26, 2013

(65) Prior Publication Data

US 2014/0093983 A1    Apr. 3, 2014

Related U.S. Application Data

(63) Continuation of application No. 13/569,785, filed on Aug. 8, 2012, now Pat. No. 8,518,792.

(60) Provisional application No. 61/522,979, filed on Aug. 12, 2011.

(51) Int. Cl.
*H01L 21/00*    (2006.01)
*H01L 43/02*    (2006.01)
*H01L 27/115*   (2006.01)
*H01L 27/22*    (2006.01)

(52) U.S. Cl.
CPC .......... *H01L 43/02* (2013.01); *H01L 27/11504* (2013.01); *H01L 27/11507* (2013.01); *H01L 27/228* (2013.01)

(58) Field of Classification Search
CPC ................... H01L 27/11504; H01L 27/11507; H01L 27/228; H01L 43/02
See application file for complete search history.

(56) References Cited

U.S. PATENT DOCUMENTS 4,888,733 A    12/1989  Mobley
4,914,627 A    4/1990   Eaton et al.
(Continued)

OTHER PUBLICATIONS

U.S. Appl. No. 13/569,785: "Method for Fabricating a Damascene Self-Aligned Ferroelectric Random Access Memory (F-RAM) Having a Ferroelectric Capacitor Aligned with a Three Dimensional Transistor Structure" Shan Sun et al., filed Aug. 8, 2012; 62 pages.
(Continued)

*Primary Examiner* — Whitney T Moore
*Assistant Examiner* — Joseph Galvin, III

(57) ABSTRACT

A method for a non-volatile, ferroelectric random access memory (F-RAM) device that includes a ferroelectric capacitor aligned with a preexisting structure is described. In one embodiment, the method includes forming an opening in an insulating layer over a contact in a planar surface of a substrate to expose at least a portion of the contact. Next a self-aligned contact (SAC) is formed electrically coupling to the contact, the SAC medially located in the opening and proximal to a sidewall thereof. A ferroelectric spacer is then formed in the opening medially of the SAC, and a top electrode spacer formed in the opening over the insulating cap and medially of the ferroelectric spacer.

20 Claims, 26 Drawing Sheets

(56) References Cited

U.S. PATENT DOCUMENTS

| | | |
|---|---|---|
| 5,394,367 A | 2/1995 | Downs et al. |
| 5,864,932 A | 2/1999 | Evans et al. |
| 5,920,453 A | 7/1999 | Evans et al. |
| 5,990,513 A | 11/1999 | Perino et al. |
| 6,027,947 A | 2/2000 | Evans et al. |
| 6,150,184 A | 11/2000 | Evans et al. |
| 6,174,735 B1 | 1/2001 | Evans |
| 6,190,926 B1 | 2/2001 | Perino et al. |
| 6,201,726 B1 | 3/2001 | Evans |
| 6,211,542 B1 | 4/2001 | Eastep et al. |
| 6,242,299 B1 | 6/2001 | Hickert |
| 6,249,014 B1 | 6/2001 | Bailey |
| 6,281,023 B2 | 8/2001 | Eastep et al. |
| 6,358,755 B1 | 3/2002 | Evans |
| 6,376,259 B1 | 4/2002 | Chu et al. |
| 6,423,592 B1 | 7/2002 | Sun |
| 6,492,673 B1 | 12/2002 | Fox et al. |
| 6,495,413 B2 | 12/2002 | Sun et al. |
| 6,597,028 B2 | 7/2003 | Fox et al. |
| 6,613,586 B2 | 9/2003 | Bailey |
| 2003/0075753 A1* | 4/2003 | Chu .................. H01L 28/91 257/308 |
| 2004/0191929 A1* | 9/2004 | Lee .................. H01L 27/11502 438/3 |
| 2005/0170599 A1* | 8/2005 | Joo .................. H01L 28/91 438/396 |
| 2012/0040508 A1 | 2/2012 | Oh et al. |

OTHER PUBLICATIONS

USPTO Notice of Allowance for U.S. Appl. No. 13/569,785 dated Jun. 13, 2013; 9 pages.

SIPO Office Action for Chinese Application No. 201210287793.0 dated Nov. 15, 2014; 3 pages.

\* cited by examiner

METHOD FOR FABRICATING A DAMASCENE SELF-ALIGNED FERROELECTRIC RANDOM ACCESS MEMORY (F-RAM) HAVING A FERROELECTRIC CAPACITOR ALIGNED WITH A THREE DIMENSIONAL TRANSISTOR STRUCTURE

CROSS REFERENCE TO RELATED PATENT APPLICATIONS

This application is a continuation of U.S. patent application Ser. No. 13/569,785, filed Aug. 8, 2012, which claims the benefit of U.S. Provisional Patent Application No. 61/522,979, filed Aug. 12, 2011, all of which are incorporated by reference herein in their entirety. The present invention is also related to the subject matter disclosed in U.S. patent application Ser. No. 13/569,735, filed Aug. 8, 2012, for "Method for Fabricating a Damascene Self-Aligned Ferroelectric Random Access Memory (F-RAM) Device Structure Employing Reduced Processing Steps," and in U.S. patent application Ser. No. 13/569,755, filed Aug. 8, 2012 for "Method for Fabricating a Damascene Self-Aligned Ferroelectric Random Access Memory (F-RAM) with Simultaneous Formation of Sidewall Ferroelectric Capacitors," all of which are incorporated by reference herein in their entirety.

BACKGROUND OF THE INVENTION

The present invention relates, in general, to the field of integrated circuit (IC) memory devices. More particularly, the present invention relates to the field of non-volatile, ferroelectric random access memory (F-RAM) devices and a method for fabricating a damascene self-aligned F-RAM that allows the formation of a ferroelectric capacitor with separated PZT layers aligned with a preexisting, three dimensional (3-D) transistor structure.

According to World Semiconductor Trade Statistics (WSTS), the semiconductor market reached an important milestone in 2010, posting worldwide revenues of more than $300 billion (in United States dollars) for the first time in the industry's history. In particular, the memory chip segment exhibited the highest growth rate during 2010, increasing from $45 billion in 2009 to $71 billion in 2010, representing a 57% year-over-year growth rate. Embedded memory devices represented more than 23% of the overall semiconductor market in 2010.

Within this context, the increasing demand for higher processing power is driving the semiconductor industry to develop memory devices with higher operational speeds in order to support the capabilities of modern electronic devices. F-RAM has emerged as a promising option for the industry, particularly in the market areas of mobile computing, smart meters, radio frequency identification (RFID) devices, office equipment and other applications requiring non-volatile data storage.

Standard dynamic random access memory (DRAM) and static random access memory (SRAM) devices, while providing relatively fast access times, are considered to be volatile memory devices inasmuch as data stored in such memories is lost when power is interrupted. In contrast, non-volatile memory devices are those that function to retain data despite any loss of power.

F-RAM devices are inherently non-volatile, meaning that these memory devices are able to retain stored data while the device is not powered. In comparison to electrically erasable programmable read only memory (EEPROM) FLASH memory devices, which are currently the most popular type of non-volatile memory, F-RAM devices have several advantages including lower power requirements (operational voltages of just 5V needed during read-write operations), higher read-write speeds (less than 70 nanoseconds), and virtually unlimited write endurance capability (more than 10,000,000,000 write cycles.

F-RAM memory devices may be fabricated based on the use of lead zirconium titanate (PZT) ferroelectric storage capacitors as memory elements integrated with complementary metal oxide semiconductor (CMOS) addressing, selection, and control logic. PLZT is a Lanthanum-doped form of PZT wherein some of the lead is replaced with lanthanum.

It is also known that PZT may also be doped with Strontium and Calcium to improve its ferroelectric dielectric properties. Ferroelectric storage capacitors having a strontium bismuth tantalate (SBT); barium strontium titanate (BST); and strontium titanate oxide (STO) dielectrics are also known in the art.

As used in the present application, the term "PZT" shall also be considered to include PLZT, SBT, BST, STO and other comparable ferroelectric dielectric materials. Further, it should be noted that the techniques of the present invention disclosed herein are applicable to all known ferroelectric dielectrics including Perovskites and layered Perovskites (whether doped or undoped) including PZT, PLZT, BST, SBT, STO and others while simultaneously allowing for a potentially broader choice of electrode materials and the use of a forming gas anneal process step on the completed IC structure.

Regardless of the ferroelectric dielectric material employed, in operation F-RAM devices function through their ability to be polarized in one direction or another in order to store a binary value representative of a logic level "one" or "zero". The ferroelectric effect allows for the retention of a stable polarization state in the absence of an applied electric field due to the alignment of internal dipoles within the Perovskite crystals in the dielectric material. This alignment may be selectively achieved by application of an electric field which exceeds the coercive field of the material. Conversely, reversal of the applied field reverses the internal dipoles.

A hysteresis curve, wherein the abscissa and ordinate represent the applied voltage ("V") and resulting polarization ("Q") states respectively, may be plotted to represent the response of the polarization of a ferroelectric capacitor to the applied voltage. A more complete description of this characteristic hysteresis curve is disclosed, for example, in U.S. Pat. Nos. 4,914,627 and 4,888,733 assigned to Ramtron International Corporation, assignee of the present invention, the disclosures of which are herein specifically incorporated by this reference.

Representative of the current state of the art in F-RAM device fabrication is that disclosed in U.S. Pat. No. 6,150,184 for: "Method of Fabricating Partially or Completely Encapsulated Top Electrode of a Ferroelectric Capacitor," also assigned to Ramtron International Corporation. Therein described is the structure of a ferroelectric capacitor that includes a bottom electrode, a top electrode, and a ferroelectric layer located between the top and bottom electrodes that extends to completely encapsulate the top electrode, except for a contact hole to allow metallization of the top electrode. The total encapsulation of the top electrode reduces the sensitivity of the ferroelectric capacitor to hydrogen and thus improves electrical switching performance. The encapsulation technique can also be used to improve the performance of ferroelectric integrated circuits and other devices.

Further representative of the state of the art in the fabrication of F-RAM devices is that disclosed in U.S. Pat. No. 6,613,586 for: "Hydrogen Barrier Encapsulation Techniques for the Control of Hydrogen Induced Degradation of Ferroelectric Capacitors in Conjunction with Multilevel Metal Processing for Non-Volatile Integrated Circuit Memory Devices," also assigned to Ramtron International Corporation. Therein described is a device structure which ameliorates the hydrogen induced degradation of ferroelectric capacitors by completely encapsulating the capacitor within a suitable hydrogen barrier material, such as chemical vapor deposition ("CVD") or sputtered silicon nitride ($Si_3N_4$), thus ensuring process compatibility with industry standard process steps. Although the deposition process for CVD $Si_3N_4$ itself contains hydrogen, the deposition time may be kept relatively short thereby allowing the Titanium Nitride (TiN) local interconnect layer to act as a "short term" hydrogen barrier.

The disclosures of U.S. Pat. Nos. 6,150,184 and 6,613,586 are herein specifically incorporated by this reference in their entirety.

Despite the aforementioned advantages over volatile memory devices and other non-volatile technologies, F-RAMs currently account for a relatively small share of the non-volatile memory device market. Competitively, the main limitation of the F-RAM technology has been its lower storage density compared to FLASH devices coupled with higher manufacturing costs. These limitations stem primarily from the generally complex structure of current F-RAM devices which results in a manufacturing process that requires a high number of processing masks and etching steps.

As such, in order to be more competitive in the current memory device marketplace and be usable in a wider range of modern electronic devices, F-RAM devices need to be more highly integrated, implying increased storage densities and reduced manufacturing costs.

It would, therefore, be highly desirable to simplify the structure of F-RAM devices with the purpose of improving storage density capabilities. It would also be highly desirable to reduce the number of imaging materials and etching steps required during F-RAM fabrication in order to reduce manufacturing costs.

SUMMARY OF THE INVENTION

Disclosed herein is a method for forming a damascene self-aligned ferroelectric RAM (F-RAM) device comprising a ferroelectric capacitor with separated PZT layers and coupled to contact studs at the bottom and top electrodes aligned with a preexisting three dimensional (3-D) transistor structure. The fabrication method comprises the steps of depositing, on a previously defined 3-D transistor structure, a chemical vapor deposition (CVD) oxide layer which is etched based on the pattern established by a formed non-erodible mask, resulting in an opening for the F-RAM construction, followed by the deposition and etching of a titanium aluminum nitride and platinum bottom electrode layers to form spacers, application and etching of a photoresist material to form an oxide trench cap, followed by another application of a photoresist material to form an image opening to etch the sidewalls of the oxide trench, deposition and etching of a ferroelectric conformal layer ideally doped with lead zirconium titanate (PZT) to form PZT independent or separated spacers, followed by deposition and etching of a platinum top electrode layer (TE) to form TE spacers, application of a photoresist material to form an image opening to etch the sidewalls of the oxide trench, followed by the formation of two CVD tungsten, titanium/titanium nitride contact studs, contacting top electrodes of the ferroelectric capacitor with separated PZT, and application of chemical mechanical polishing (CMP) to planarize the surface of the F-RAM structure. The PZT ferroelectric layers are separated at each side of the oxide trench to increase memory density.

Also disclosed herein is a method for forming an integrated circuit device in conjunction with a 3-D transistor structure formed in a planar surface of a semiconductor substrate. The method comprises forming an insulating layer overlying the planar surface and selectively removing a portion of the insulating layer and a selected region of the planar surface beneath that portion to form an opening over the transistor structure and expose first and second contacts thereto. Conductive spacers are formed to each of the first and second contacts laterally of the opening and bottom electrode spacers are formed medially of the conductive spacers within the opening. An insulating cap is formed in a lower portion of the opening between the conductive and bottom electrode spacers and ferroelectric spacers are formed in the opening over the insulating cap and medially of the bottom electrode spacers. Top electrode spacers are formed in the opening over the insulating cap and medially of the ferroelectric spacers and an additional insulating layer is formed in the opening over the insulating cap and between the top electrode spacers. A first contact stud is formed to a first one of the top electrode spacers and a second contact stud is formed to a second one of the top electrode spacers.

Further disclosed herein is a method for forming a ferroelectric device in conjunction with a transistor structure formed in a planar surface of a semiconductor substrate. The method comprises depositing an oxide layer on the planar surface and etching an opening in the oxide layer to the transistor structure. A titanium aluminum nitride layer is deposited over the oxide layer and within the opening in contact with the transistor structure and a bottom electrode layer is deposited over the titanium aluminum nitride layer. The titanium aluminum nitride layer and the bottom electrode layer are etched except for portions adjoining the sidewalls of the opening. A trench cap is deposited over the transistor structure in a lower portion of the opening and a conformal ferroelectric dielectric layer is deposited on the trench cap and between the bottom electrode layer portions adjoining the sidewalls of the opening. The ferroelectric dielectric layer is selectively etched except for portions adjoining the bottom electrode layer portions adjoining the sidewalls of the opening and a conformal top electrode layer is deposited on the trench cap and on the ferroelectric dielectric layer portions adjoining the sidewalls of the opening. The top electrode layer is selectively etched except for portions adjoining the ferroelectric dielectric layer and an additional oxide layer is deposited over the trench cap and distal portions of the titanium aluminum nitride, bottom electrode and top electrode layers adjoining the sidewalls of the opening. A first contact opening is etched in the additional oxide layer to a top electrode layer adjoining a first of the sidewalls of the opening and a second contact opening is etched in the additional oxide layer to a top electrode layer adjoining a second opposite one of the sidewalls of the opening. Electrical contacts are formed in the first and second contact openings.

Still further disclosed herein is an integrated circuit device incorporating a transistor structure formed in a semiconductor substrate which comprises first and second spacers electrically coupled to the transistor structure and a trench cap separating the first and second spacers. First and second bottom electrodes are formed on the trench cap medially adjoining the first and second spacers respectively and first and second dielectric spacers are formed on the trench cap medially adjoining the first and second bottom electrodes respectively. First and second top electrodes are formed on the trench cap medially adjoining the first and second dielectric spacers respectively with an insulating layer separating the first and second top electrodes. A first contact is electrically coupled to the first top electrode and a second contact isolated from the first contact is electrically coupled to the second top electrode.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Disclosed herein is a non-volatile, ferroelectric random access memory (F-RAM) device and a method for fabricating a damascene self-aligned F-RAM that allows for the formation of a ferroelectric capacitor with separated PZT layers aligned with a preexisting, three dimensional (3-D) transistor structure.

A representative device method in accordance with the present invention includes the steps described in FIGS. 1 through 26 inclusive.

Figure 1:
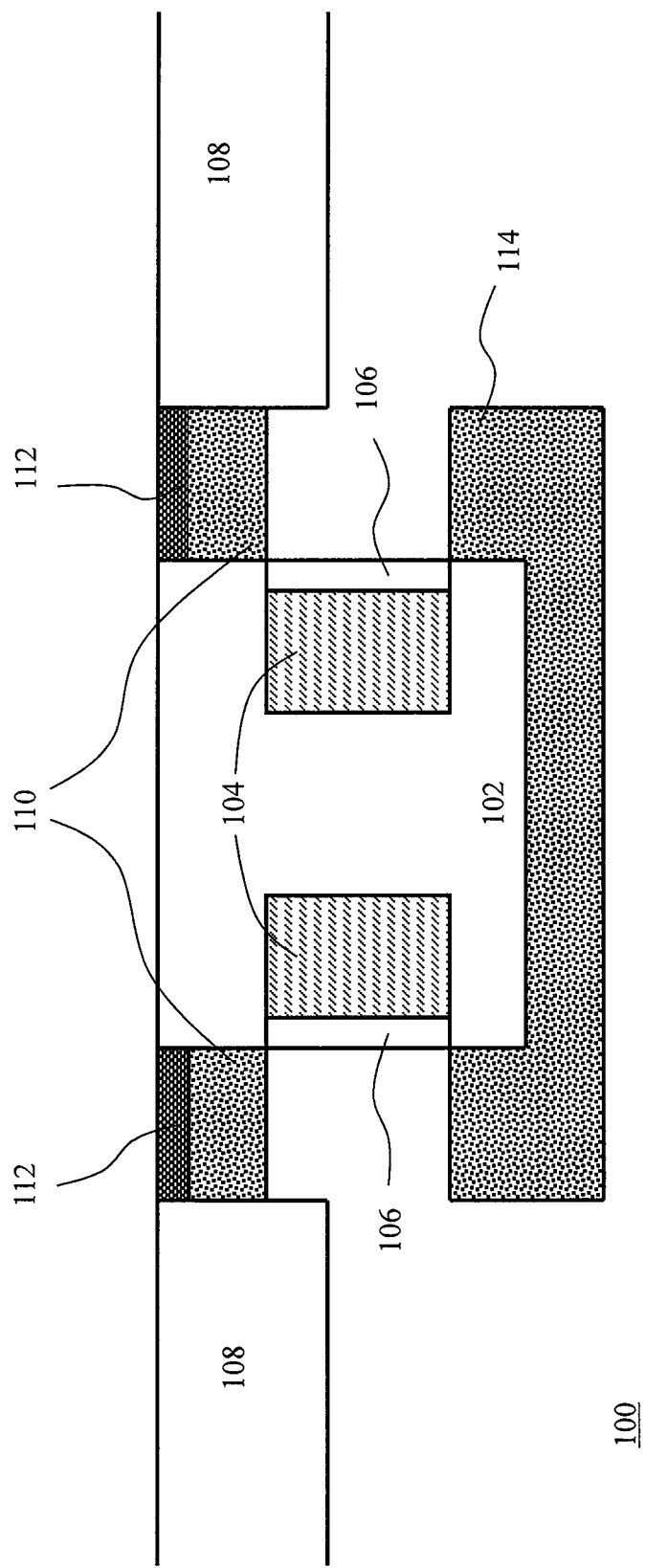
FIG. 1 is a partial, cross-sectional illustration of the 3-D transistor structure providing a depiction of transistor diffusing dopants in a semiconductor substrate.

With reference now to FIG. 1, a 3-D transistor structure 100 is shown, and provides a depiction of transistor diffusing dopants in a semiconductor substrate. In FIG. 1, the previously defined 3-D transistor structure 100 shows an oxide filled trench 102 in the semiconductor substrate (not shown in FIG. 1) containing a poly-gate 104 structure with thin oxide 106 liners at each side of the oxide filled trench 102. In the 3-D transistor structure 100 are also STI 108 regions (i.e. shallow trench isolation regions filled with oxide) and top diffusions 110 at the top of the oxide filled trench 102. The top diffusions 110 are capped by titanium silicide 112 ($TiSi_2$) which is planar with the STI 108 surface. Bottom diffusions 114 are wrapped around the oxide filled trench 102. Not depicted in FIG. 1 is that the 3-D transistor structure 100 may comprise a long-trench with poly-gate 104 structure and bottom diffusions 114 previously coupled to contact studs (also not shown in FIG. 1).

Figure 2:
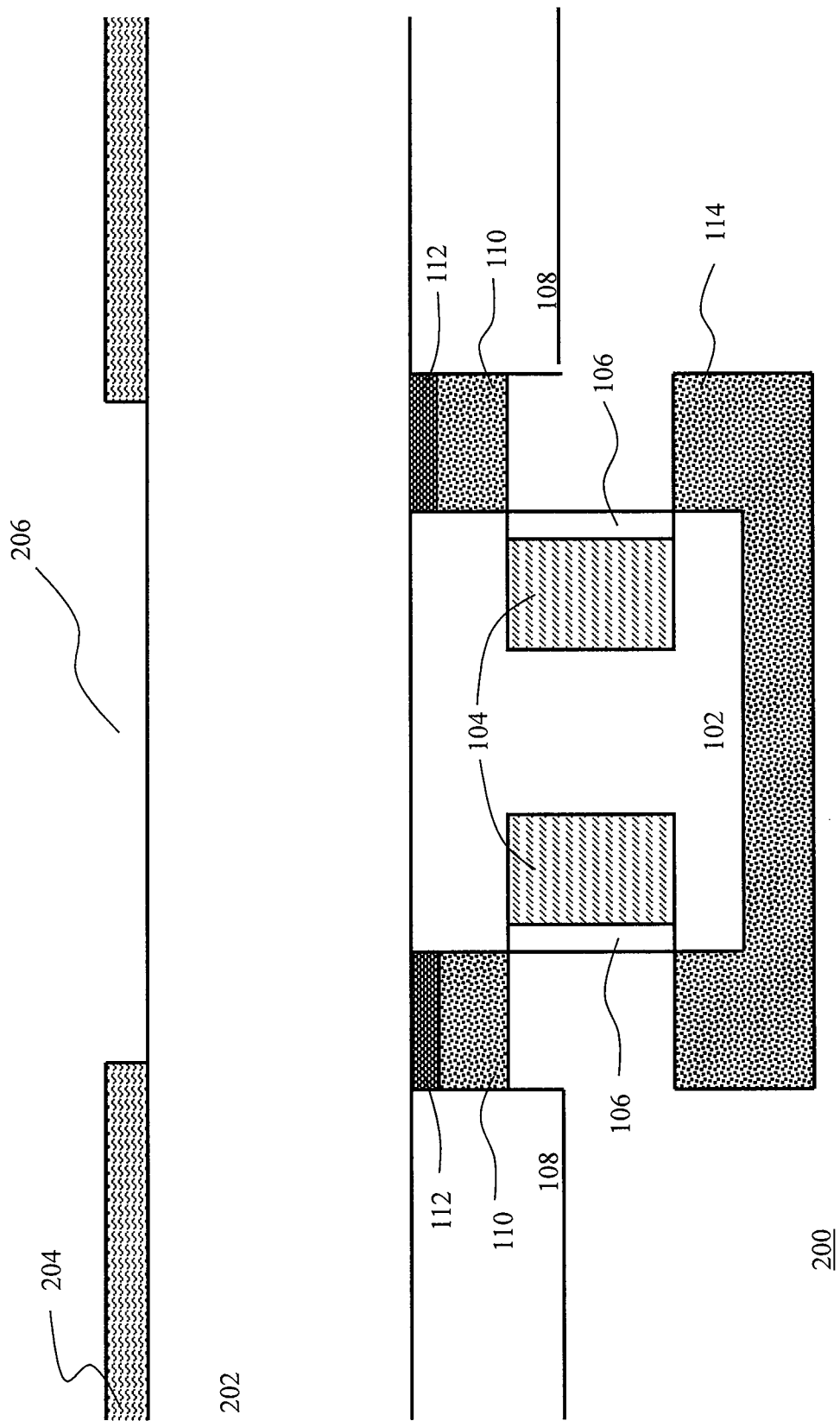
FIG. 2 is a follow-on view of the non-erodible mask structure.

With reference additionally now to FIG. 2, a non-erodible mask structure 200 is shown, depicting the chemical vapor deposition (CVD) of a planarized oxide 202 layer several microns thick over the 3-D transistor structure 100. The oxide 202 layer is planar as it is deposited over a planarized surface. A non-erodible mask 204 of silicon nitride ($Si_3N_4$) is subsequently applied and defined over the STI 108 regions and portions of the titanium silicide 112 caps. Masking is performed by defining the mask layer on top of the oxide 202 layer and then using photoresist (not shown in FIG. 2) to define the F-RAM image 206 pattern. Photoresist is a light sensitive material that when exposed to light forms the F-RAM image 206 pattern on the non-erodible mask 204 as shown in FIG. 2. When the non-erodible mask 204 is etched and the photoresist removed in an $O_2$ plasma ash, it leaves an exposed surface on the oxide 202 layer. The non-erodible mask 204 can be made of different materials such as aluminum oxide ($Al_2O_3$) and other metals such as aluminum. As such, this process allows for the use of different types of non-erodible mask materials.

Figure 3:
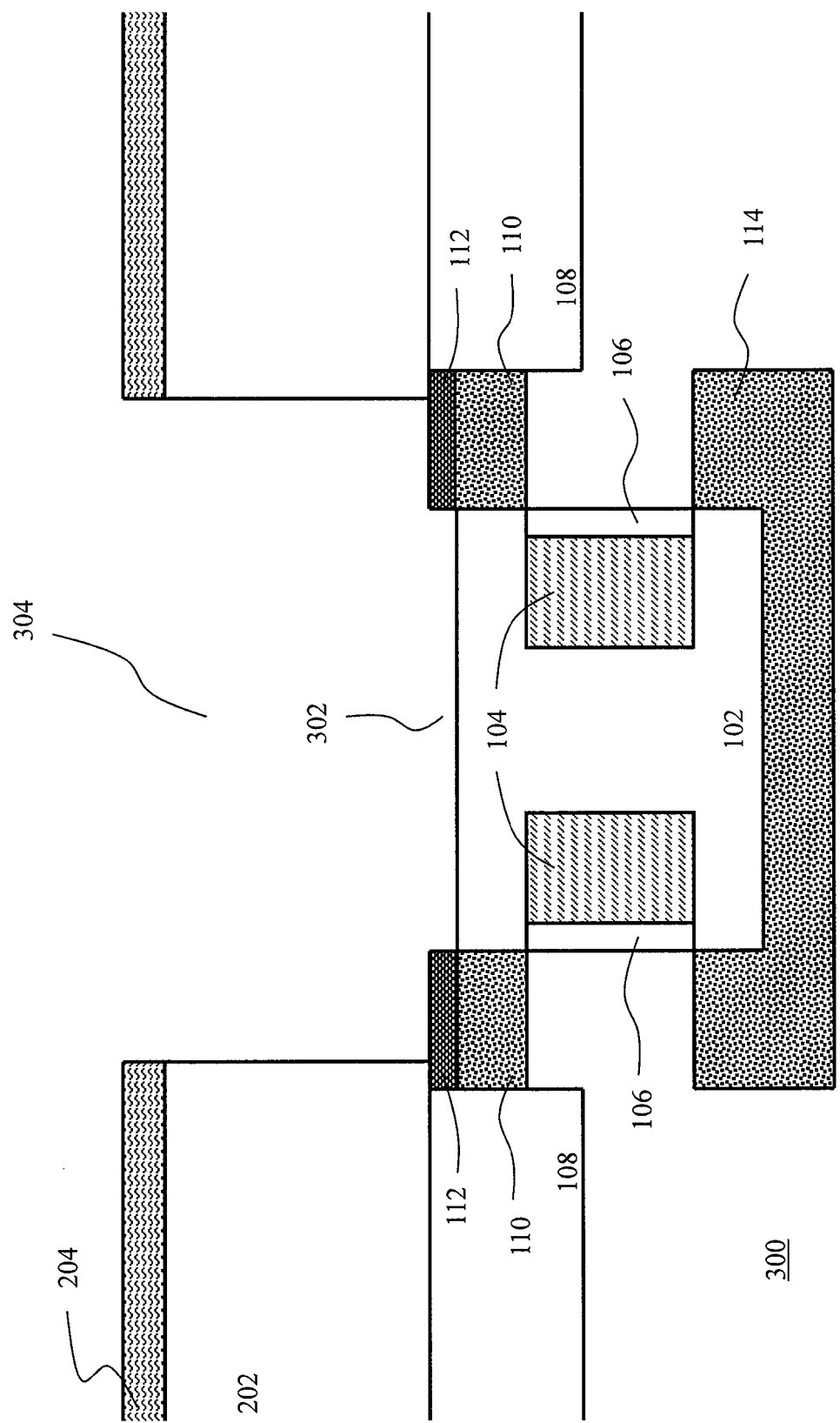
FIG. 3 is a follow-on view of the F-RAM opening structure.

With reference additionally now to FIG. 3, the F-RAM opening structure 300 is shown. In FIG. 3, the exposed surface of the oxide 202 layer in the non-erodible mask structure 200 is reactive-ion etched (RIE) down to the level of over-etch required across the wafer, whereby over-etched region 302 is formed in the oxide filled trench 102. The reactive-ion etch process on the oxide 202 layer in FIG. 3 also results in F-RAM opening 304.

Figure 4:
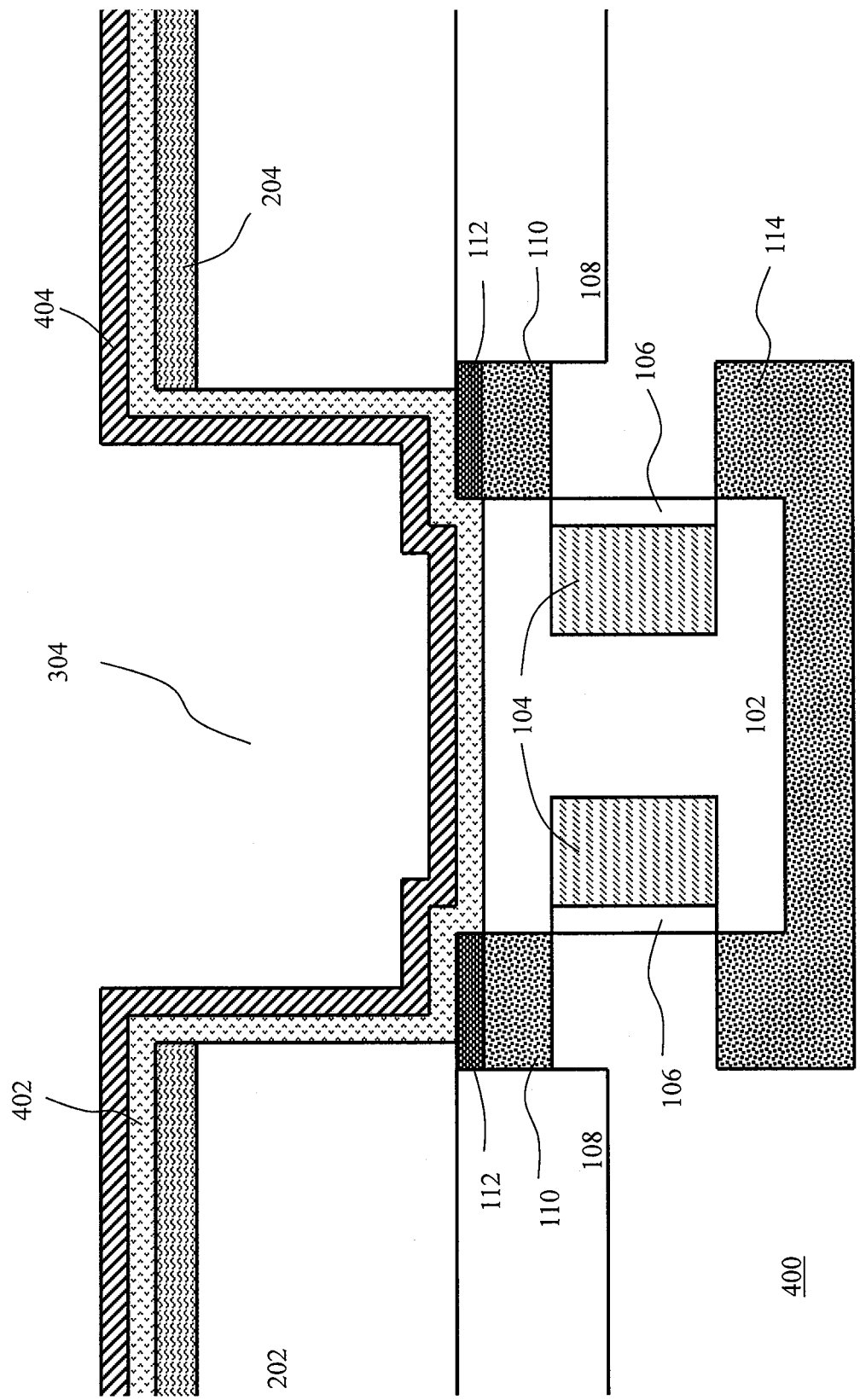
FIG. 4 is a follow-on view of the F-RAM platinum structure.

With reference additionally now to FIG. 4, the F-RAM platinum structure 400 is shown. In FIG. 4, a layer of about 1000 angstroms of titanium aluminum nitride or titanium aluminum nitride film is subsequently deposited by CVD system over the F-RAM opening structure 300, forming a conformal titanium aluminum nitride 402 layer on the top of the non-erodible mask 204, on the sides and bottom of the F-RAM opening 304 and into the over-etched region 302. Titanium tetrachloride (TiCl$_4$), dimethylethylamine alane (DMEAA) and ammonia gas may be used as source gases for the CVD of titanium aluminum nitride.

Also in FIG. 4, a conformal layer of platinum of about 500 to 1000 angstroms is subsequently deposited by chemical vapor deposition over the top of the titanium aluminum nitride 402 layer, forming the platinum 404 bottom electrode layer. This platinum 404 bottom electrode layer covers the top of the titanium aluminum nitride 402 conformal layer. While in the representative embodiment illustrated platinum is used for the bottom electrode (BE) layer, other known materials compatible with ferroelectric films could also be used, including iridium (Ir) and iridium oxide (IrOx), palladium (Pd) and palladium oxide (PdOx), ruthenium (Ru) and ruthenium oxide (RuOx), rhodium (Rh) and rhodium oxide (RhOx).

Figure 5:
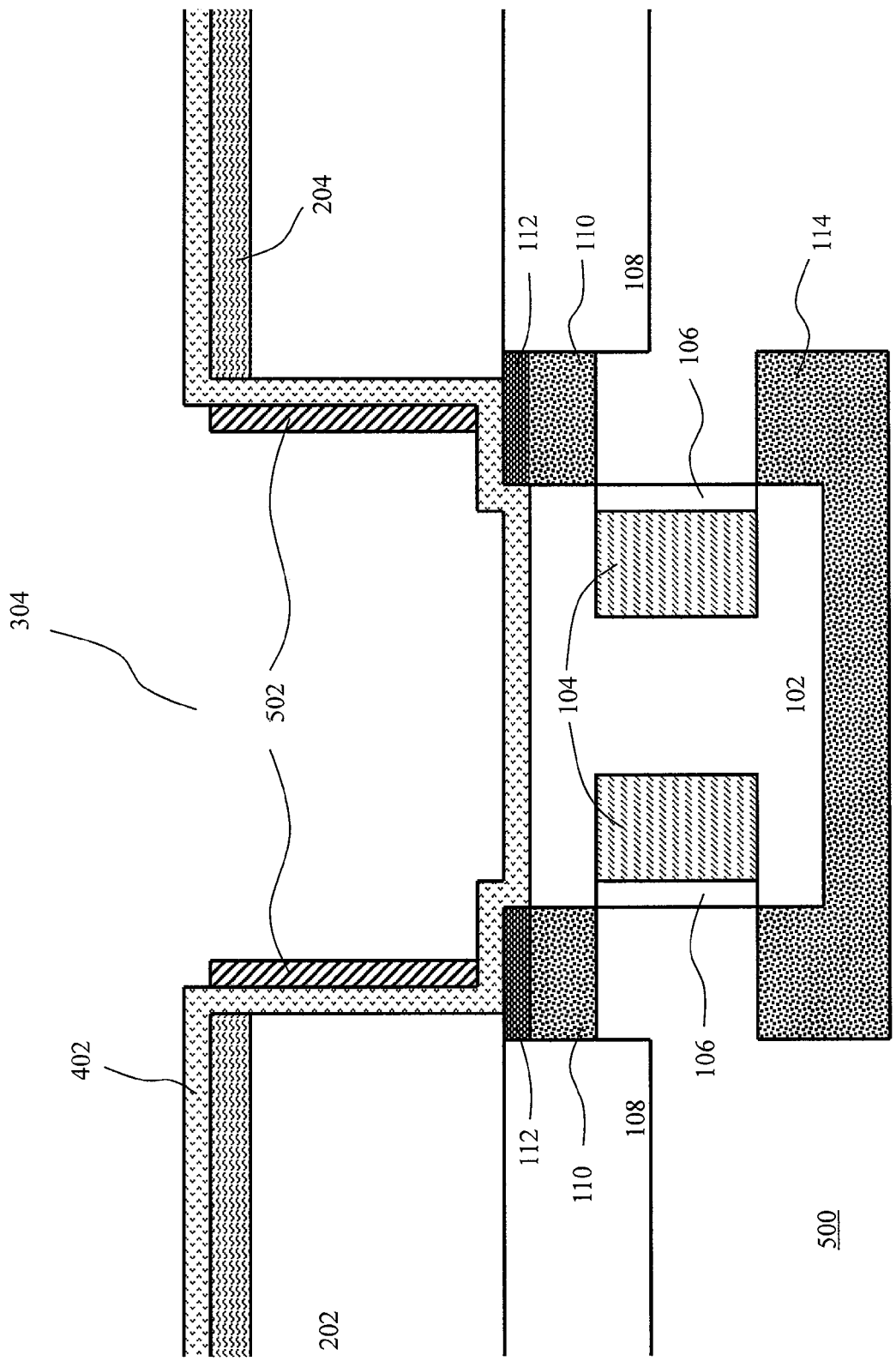
FIG. 5 is a follow-on view of the F-RAM structure with platinum BE spacers.

With reference additionally now to FIG. 5, the removal of a portion of the platinum 404 bottom electrode (BE) layer in the F-RAM platinum structure 400 is depicted, creating F-RAM structure with platinum BE spacers 500. In FIG. 5, the platinum 404 BE layer is etched away from the top of the titanium aluminum nitride 402 layer and bottom of the F-RAM opening 304, using a reactive-ion etch process, forming platinum BE spacers 502. Note that in this process step, the platinum BE spacers 502 are etched planar with the surface level of the non-erodible mask 204. Platinum is typically etched using a reactive-ion etch technique, although other gases may be used. Ion milling can be used as well as an alternative etching technique.

Figure 6:
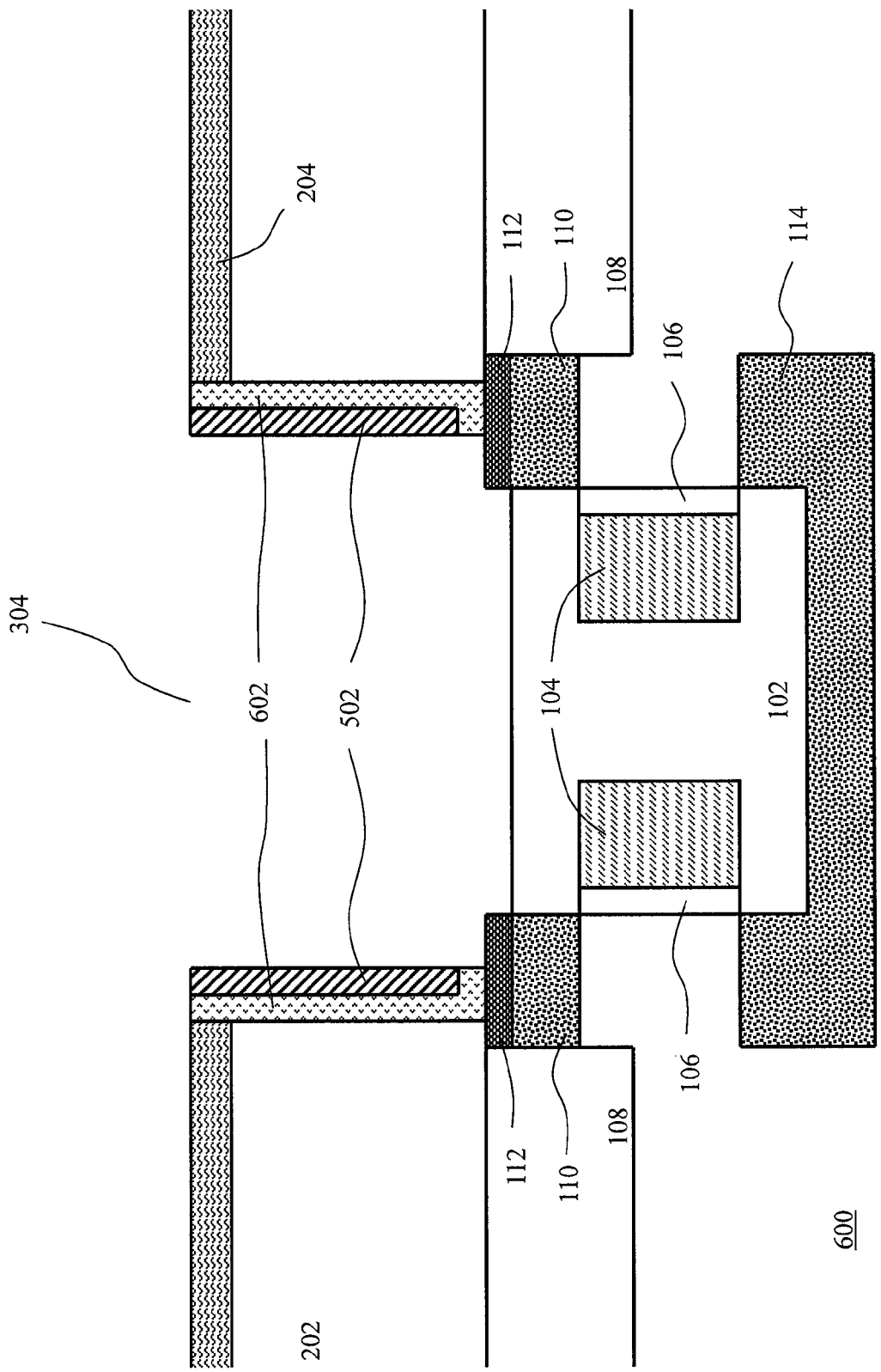
FIG. 6 is a follow-on view of the F-RAM structure with titanium aluminum nitride spacers.

With reference additionally now to FIG. 6, the removal of a portion of the titanium aluminum nitride conformal layer is shown, creating an F-RAM structure with titanium aluminum nitride spacers 600. In FIG. 6, a portion of the conformal titanium aluminum nitride 402 layer is removed from the top of the non-erodible mask 204 and bottom of the F-RAM opening 304 using a reactive-ion etch technique. This etching forms the titanium aluminum nitride spacers 602 on the sides of the F-RAM opening 304. Note that the titanium aluminum nitride spacers 602 and platinum BE spacers 502 are planar with the surface of the non-erodible mask 204.

Figure 7:
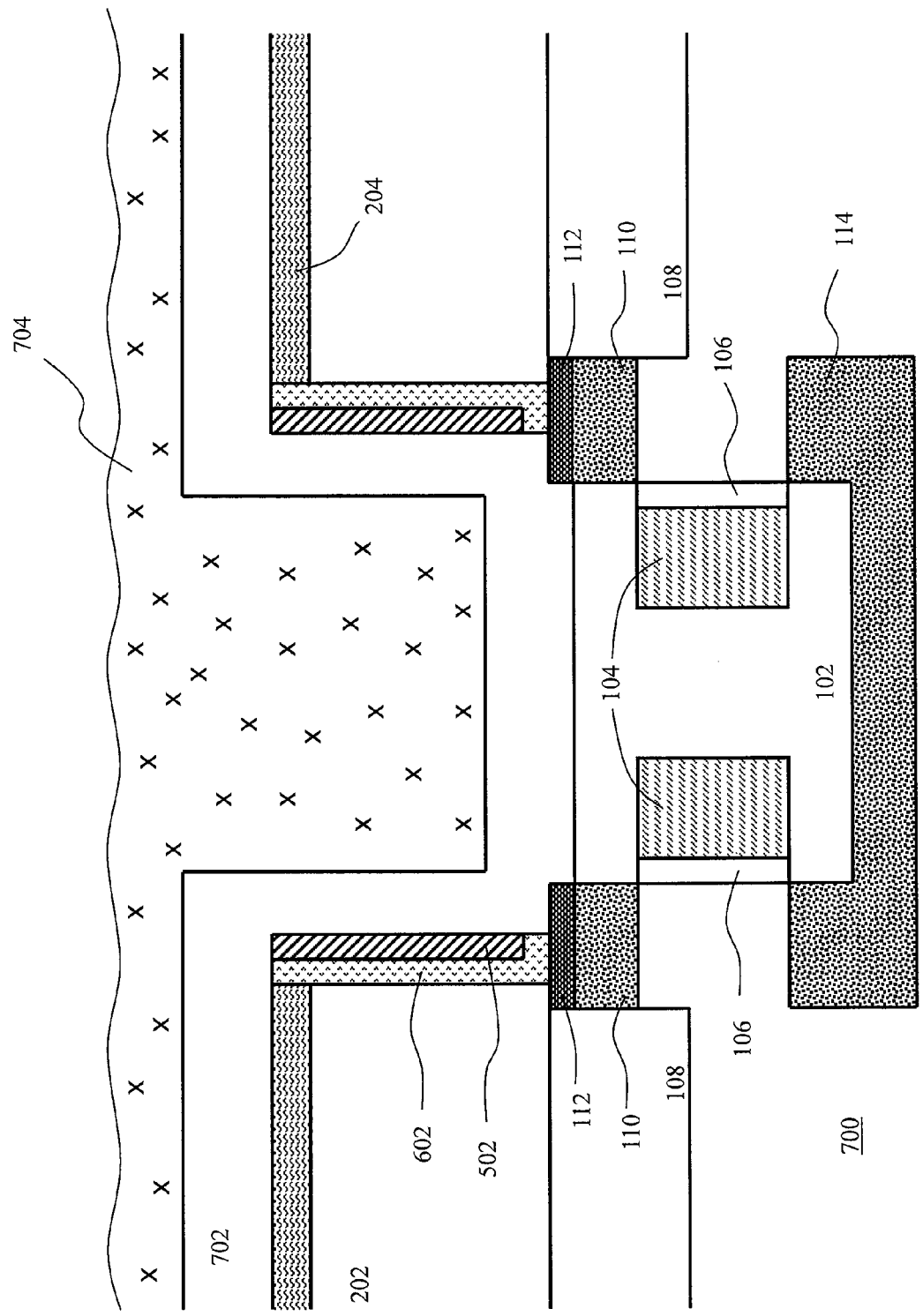
FIG. 7 is a follow-on view of the photoresist application structure.

With reference additionally now to FIG. 7, the application of a CVD oxide layer and a photoresist material on top of the F-RAM structure with titanium aluminum nitride spacers 600 is depicted, forming photoresist application structure 700. In FIG. 7, a conformal oxide 702 layer is deposited using a CVD process over the top of the F-RAM structure with titanium aluminum nitride spacers 600. A photoresist 704 material is subsequently spun applied over the top of the oxide 702 layer, filling the F-RAM opening 304.

Figure 8:
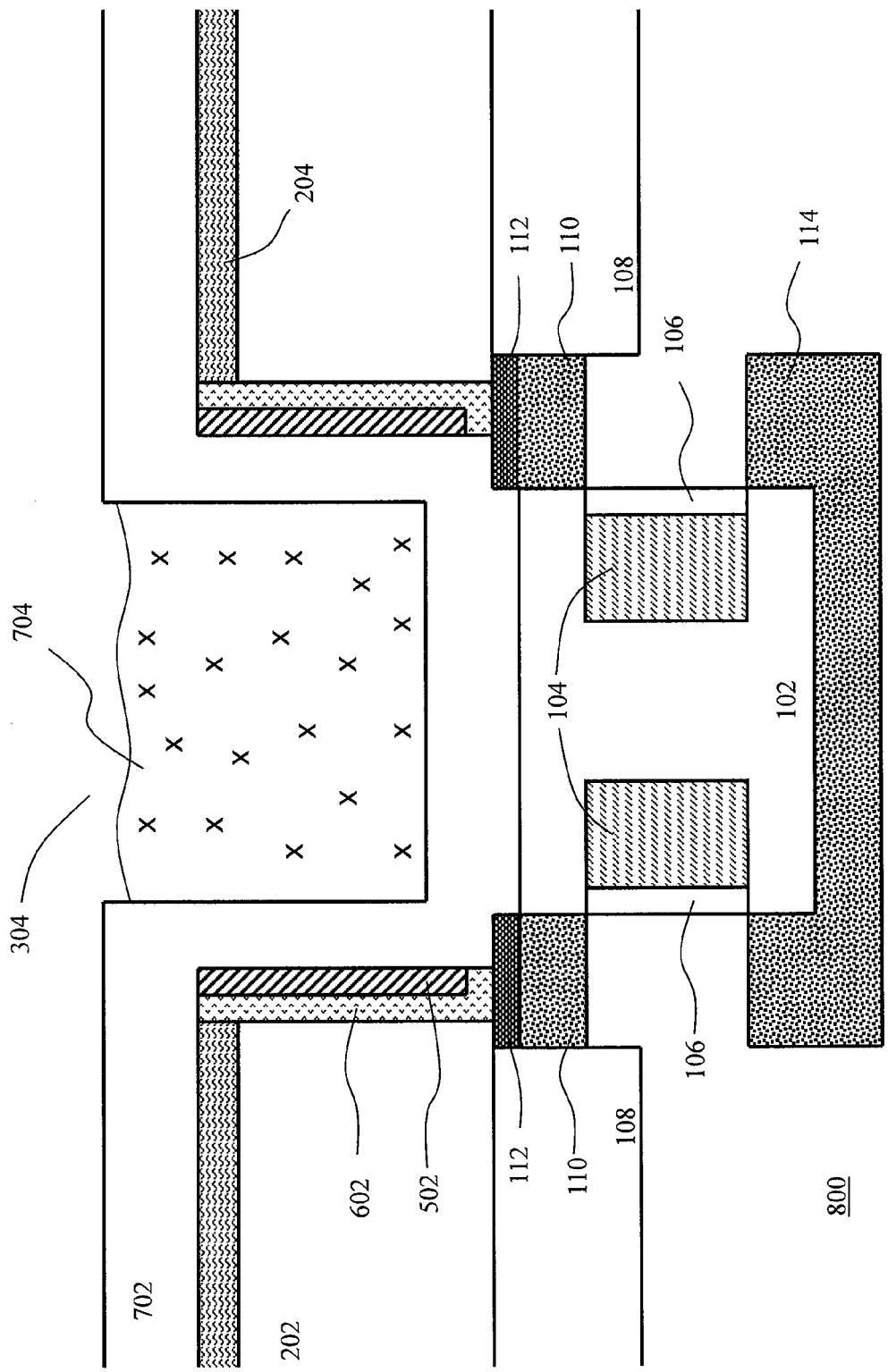
FIG. 8 is a follow-on view of the etched photoresist structure.

With reference additionally now to FIG. 8, the etching of the photoresist material in the photoresist application structure 700 is shown, creating etched photoresist structure 800. In FIG. 8, a portion of the photoresist 704 material is etched away using a plasma oxygen (O$_2$) plasma ash in order to shape a structure below the surface of the oxide 702 layer, leaving the photoresist 704 material in the F-RAM opening 304.

Figure 9:
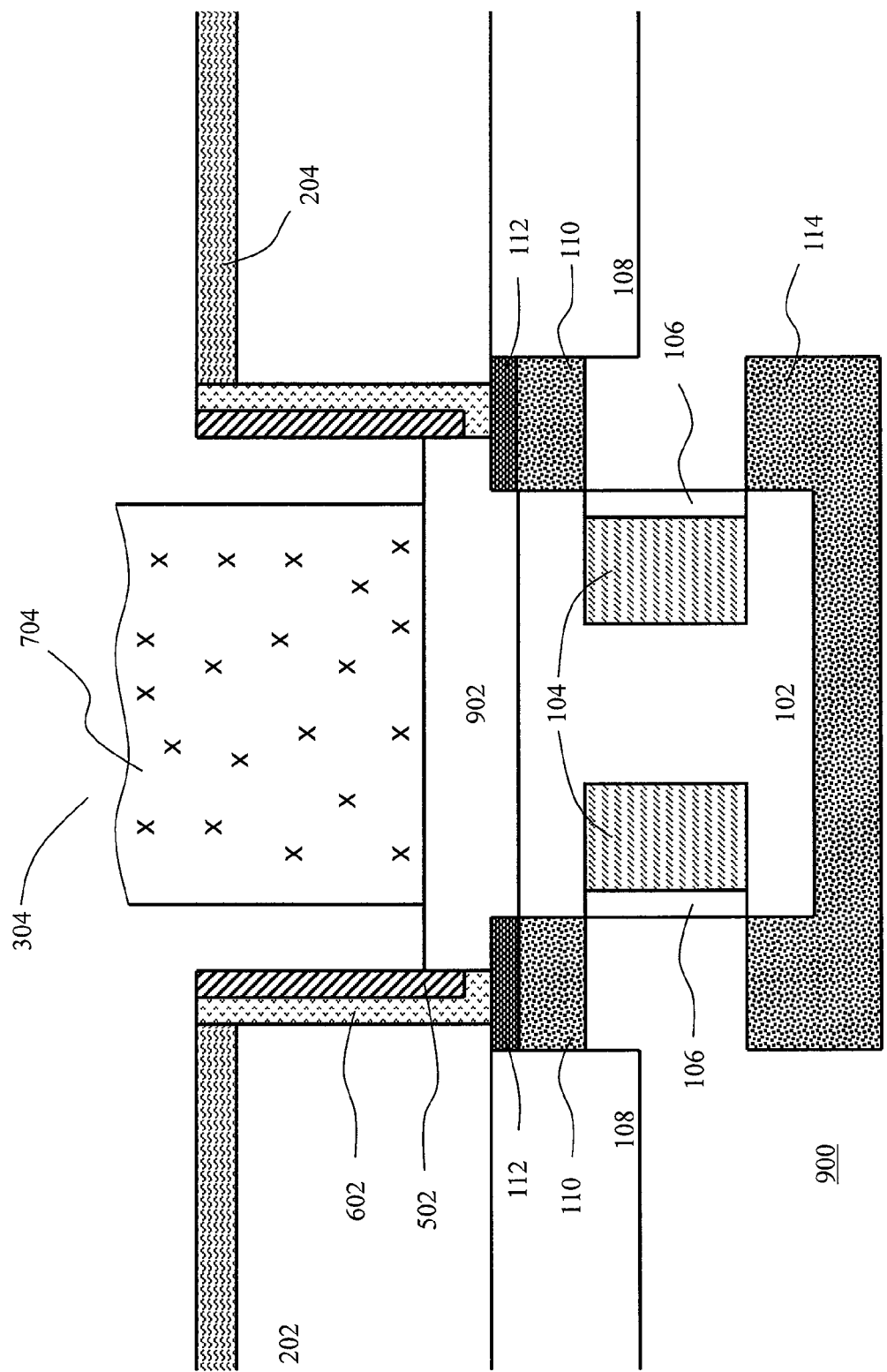
FIG. 9 is a follow-on view of the trench cap structure.

With reference additionally now to FIG. 9, the removal of a portion of the oxide 702 layer in the etched photoresist structure 800 is shown to create trench cap structure 900. In FIG. 9, the oxide 702 layer is reactive-ion etched down to the base of the photoresist 704 material, by means of a timed etch, forming a trench cap 902 composed of the remaining oxide 702 layer.

Figure 10:
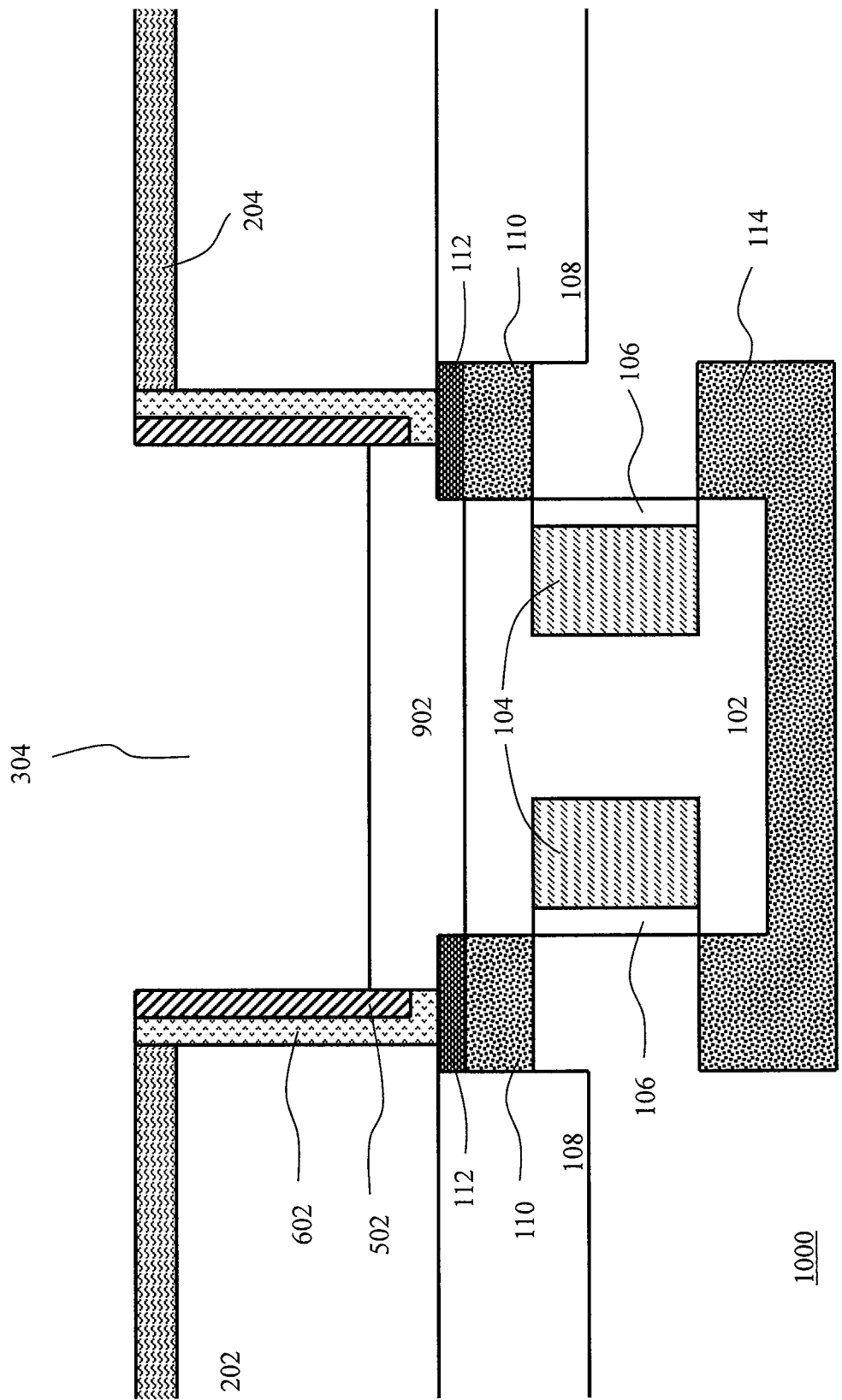
FIG. 10 is a follow-on view of the exposed trench cap structure.

With reference additionally now to FIG. 10, the removal of the remainder of the photoresist material in the trench cap structure 900 is shown, forming an exposed trench cap structure 1000. In FIG. 10, the photoresist 704 material is completely removed by the same O$_2$ plasma ash process described in FIG. 8, exposing the trench cap 902 surface. Note that the trench cap 902 (composed of oxide) completely fills the over-etched region 302.

Figure 11:
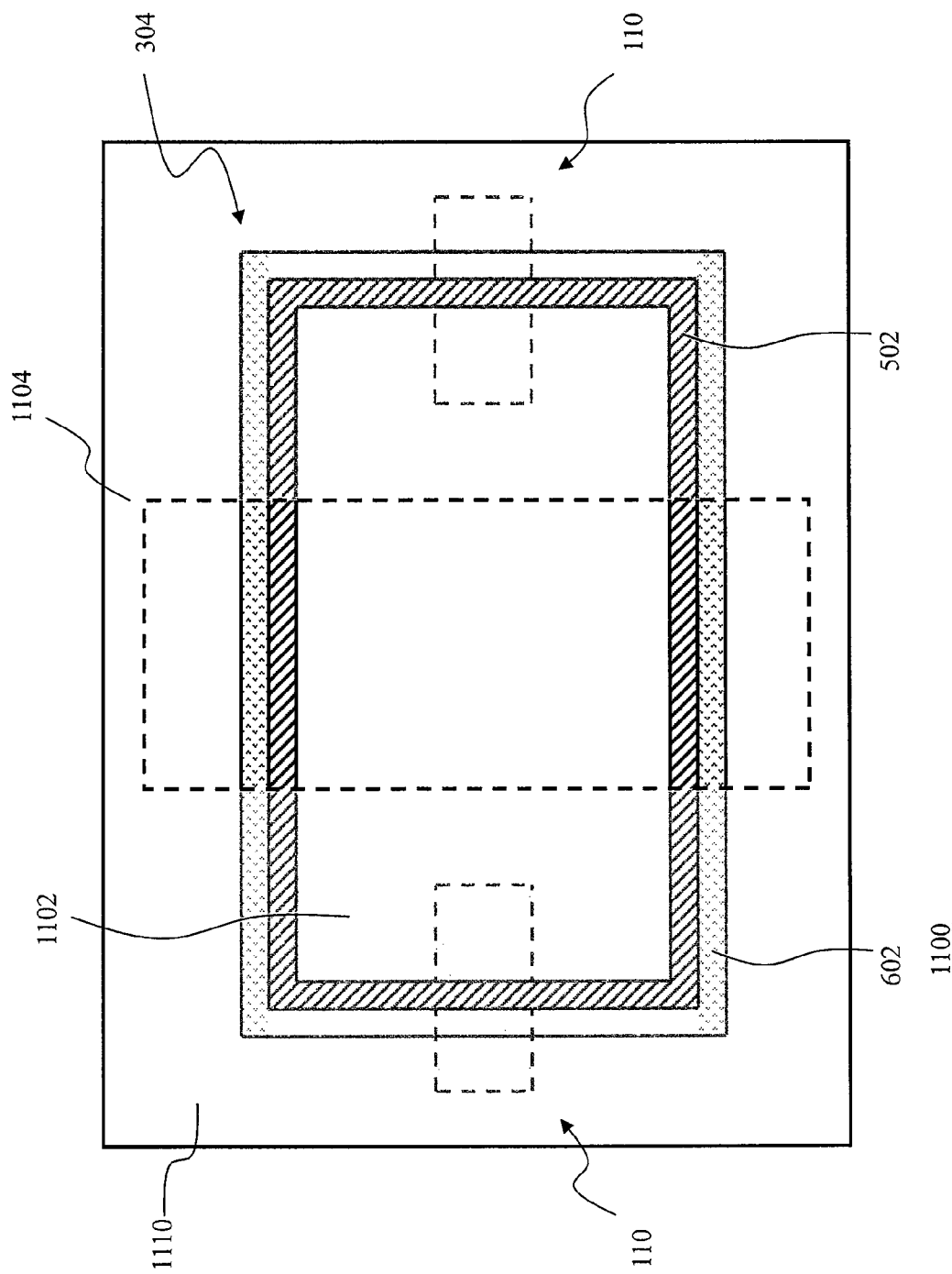
FIG. 11 is a partial, top plan view of the F-RAM opening structure after the formation of titanium aluminum nitride spacers and bottom electrode spacers.

With reference additionally now to FIG. 11, a top plan view of the F-RAM opening structure 1100 is shown. From a top view perspective, FIG. 11 illustrates the top diffusions 110 at each side of the F-RAM opening 304. FIG. 11 also depicts the titanium aluminum nitride spacers 602 and platinum BE spacers 502 around the sidewalls of the F-RAM opening 304. On top of the F-RAM opening 304 structure, a photoresist 1102 material is applied and then it is imaged and photo-developed to form image opening 1104 (the dotted rectangle) across F-RAM opening 304. Resist 1110 is left on the surface outside image opening 1104.

Figure 12:
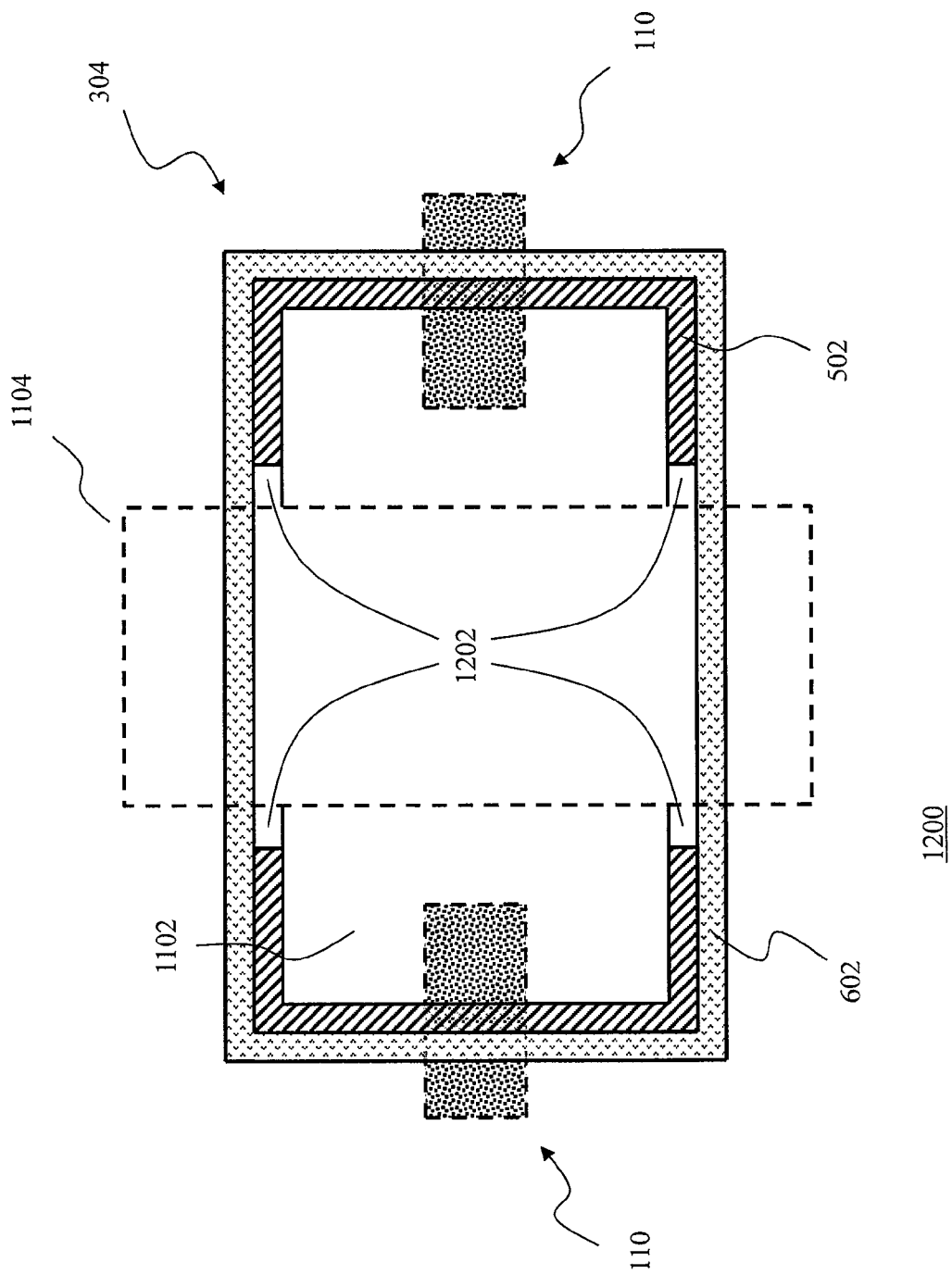
FIG. 12 is a follow-on view of the etched platinum BE spacers structure.

With reference additionally now to FIG. 12, the etching of the platinum around the sidewalls on the F-RAM opening structure 1100 is depicted to create etched platinum BE spacers structure 1200. In FIG. 12, using the pattern defined by the image opening 1104, the exposed surface of the platinum BE spacers 502 around the sidewalls of the F-RAM opening 304 is wet etched away producing undercut regions 1202 underneath the photoresist material 1102.

Figure 13:
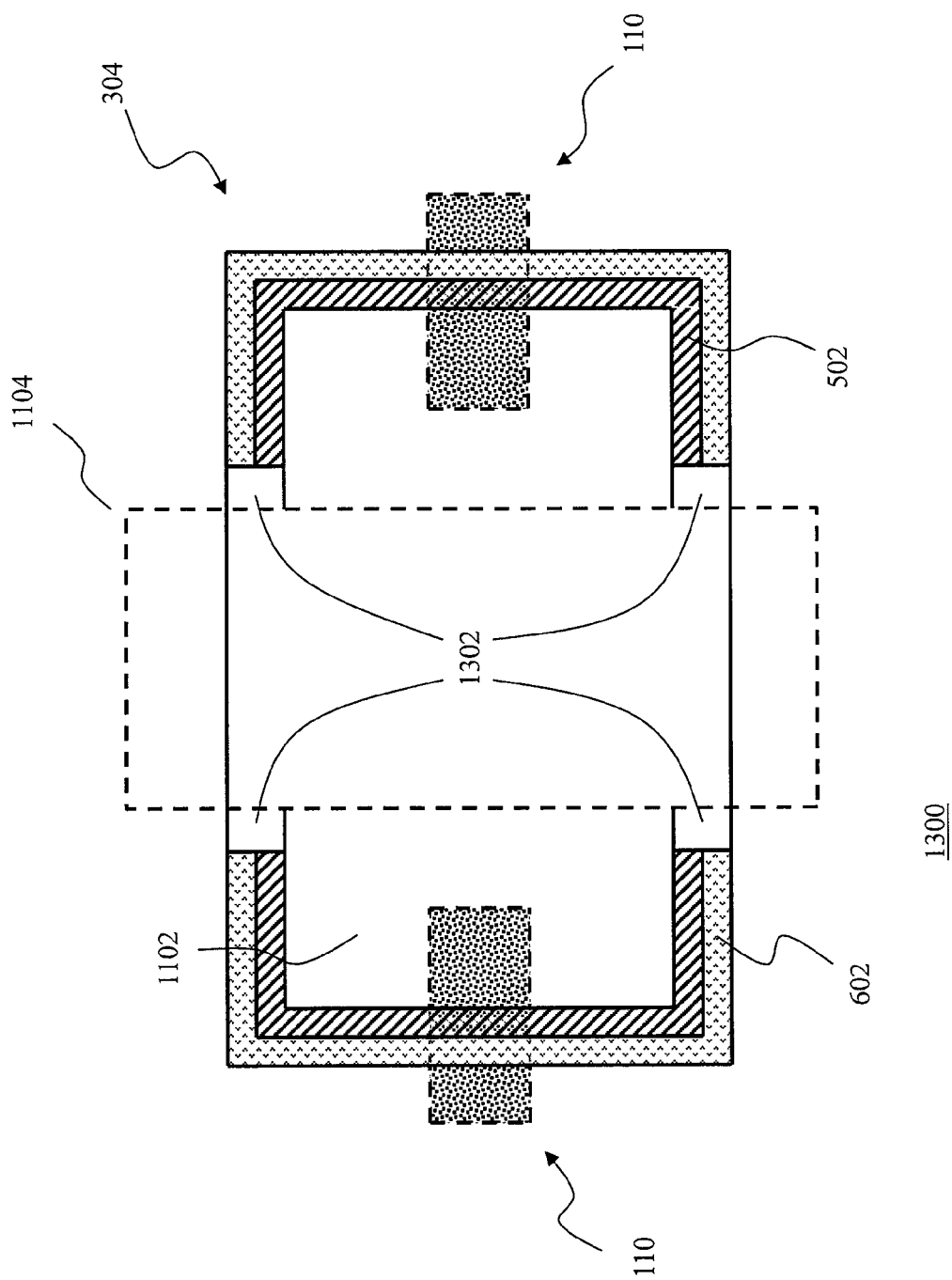
FIG. 13 is a follow-on view of the etched titanium aluminum nitride spacers structure.

With reference additionally now to FIG. 13, the etching of the titanium aluminum nitride in the etched platinum BE spacers structure 1200 is illustrated, forming etched titanium aluminum nitride spacers structure 1300. In FIG. 13, employing the same pattern defined by the image opening 1104, a portion of the titanium aluminum nitride spacers 602 around the sidewalls of the F-RAM opening 304 is isotropically wet etched away, forming over-etched regions 1302 underneath the photoresist 1102. Note that the titanium aluminum nitride spacers 602 are etched back to the same level as the platinum BE spacers 502.

Figure 14:
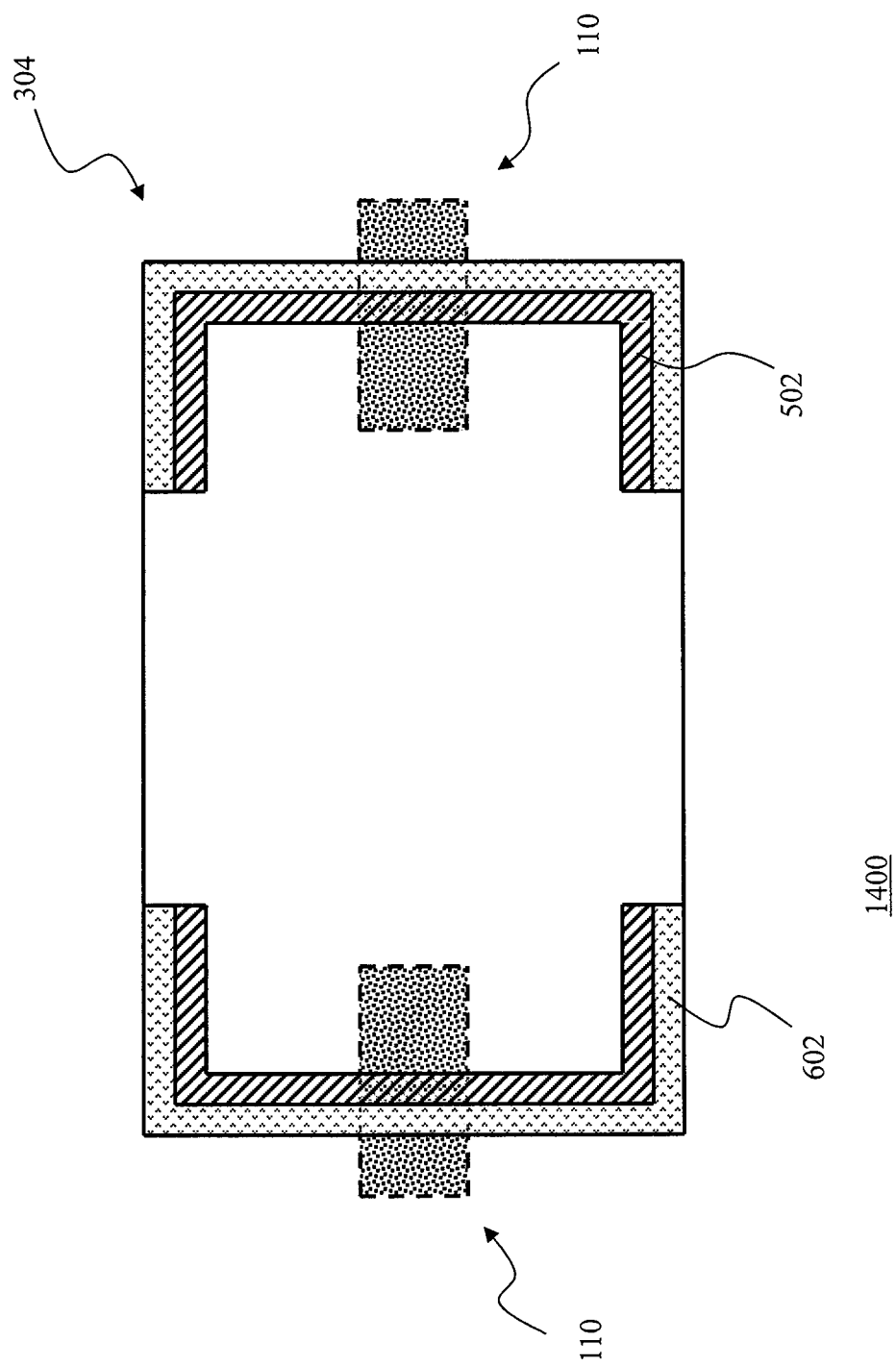
FIG. 14 is a follow-on view of the F-RAM opening structure after the etching of sidewalls.

With reference additionally now to FIG. 14, the removal of the photoresist material from the etched titanium aluminum nitride spacers structure 1300 is depicted, creating F-RAM opening structure 1400. In FIG. 14, the remaining photoresist 1102 material is etched away using an O$_2$ plasma etching technique and removed with a vacuum pump.

Figure 15:
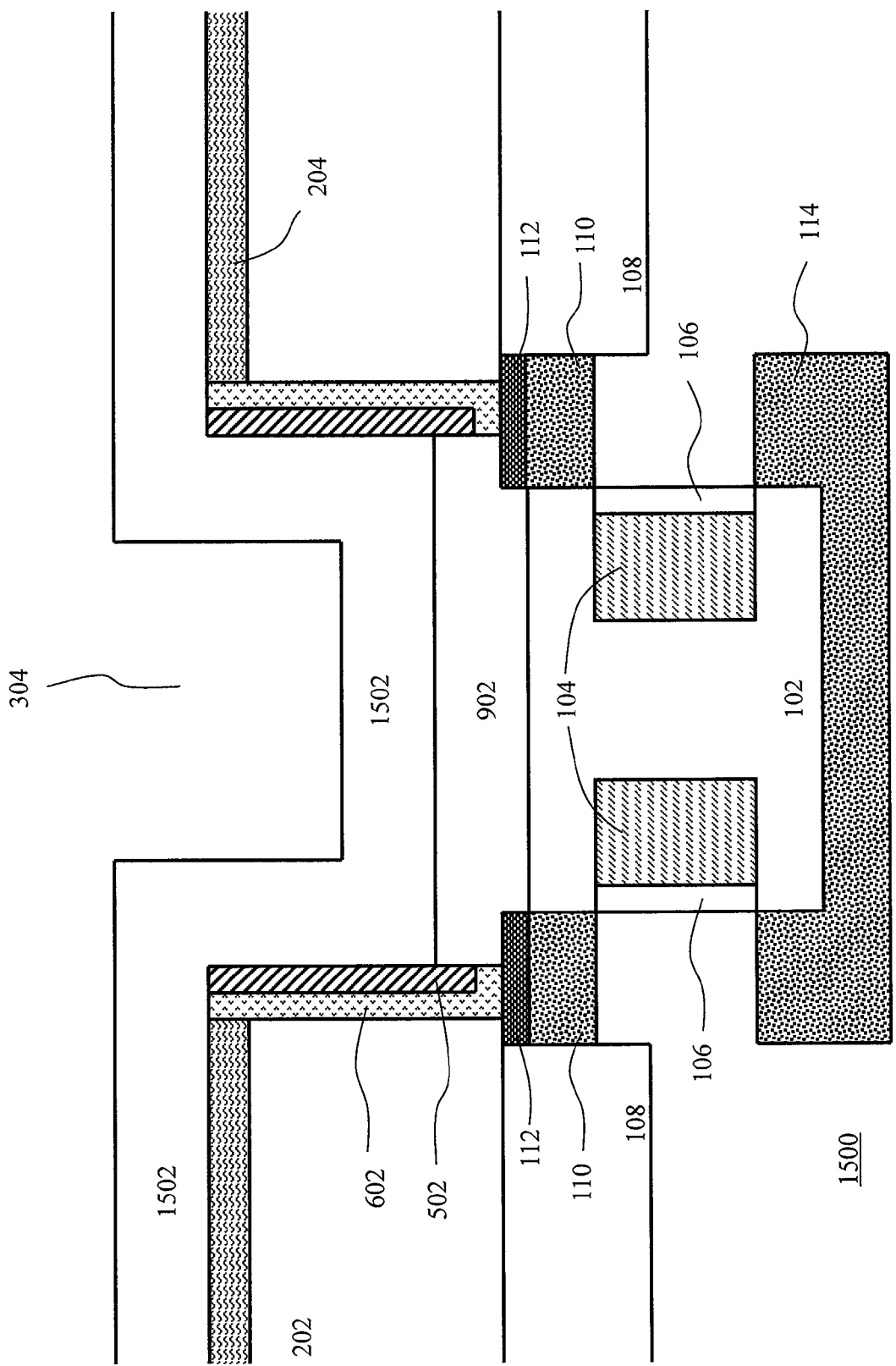
FIG. 15 is a partial, cross-sectional illustration of the F-RAM PZT structure.

With reference additionally now to FIG. 15, a cross-sectional view of a device in accordance with the present invention is illustrated and shows the addition of a layer of ferroelectric material to the F-RAM structure 1400, creating F-RAM PZT structure 1500. In FIG. 15, a conformal ferroelectric layer of PZT 1502, ideally doped with PZT (lead zirconium titanate), is CVD deposited and planarized on top of the trench cap 902, the top of the non-erodible mask 204 layer and into the F-RAM opening 304 to a thickness of about 2000 to 3000 angstroms. The PZT 1502 material may be formed of lead (Pb), zirconium (Zr), and titanium (Ti) atoms, with an atomic ratio of the Zr atoms to the Ti atoms (Zr:Ti) of less than 2:3. While PZT 1502 is used as the ferroelectric layer, other known ferroelectric compounds such as strontium bismuth tantalate (SBT) and others may also be employed.

Figure 16:
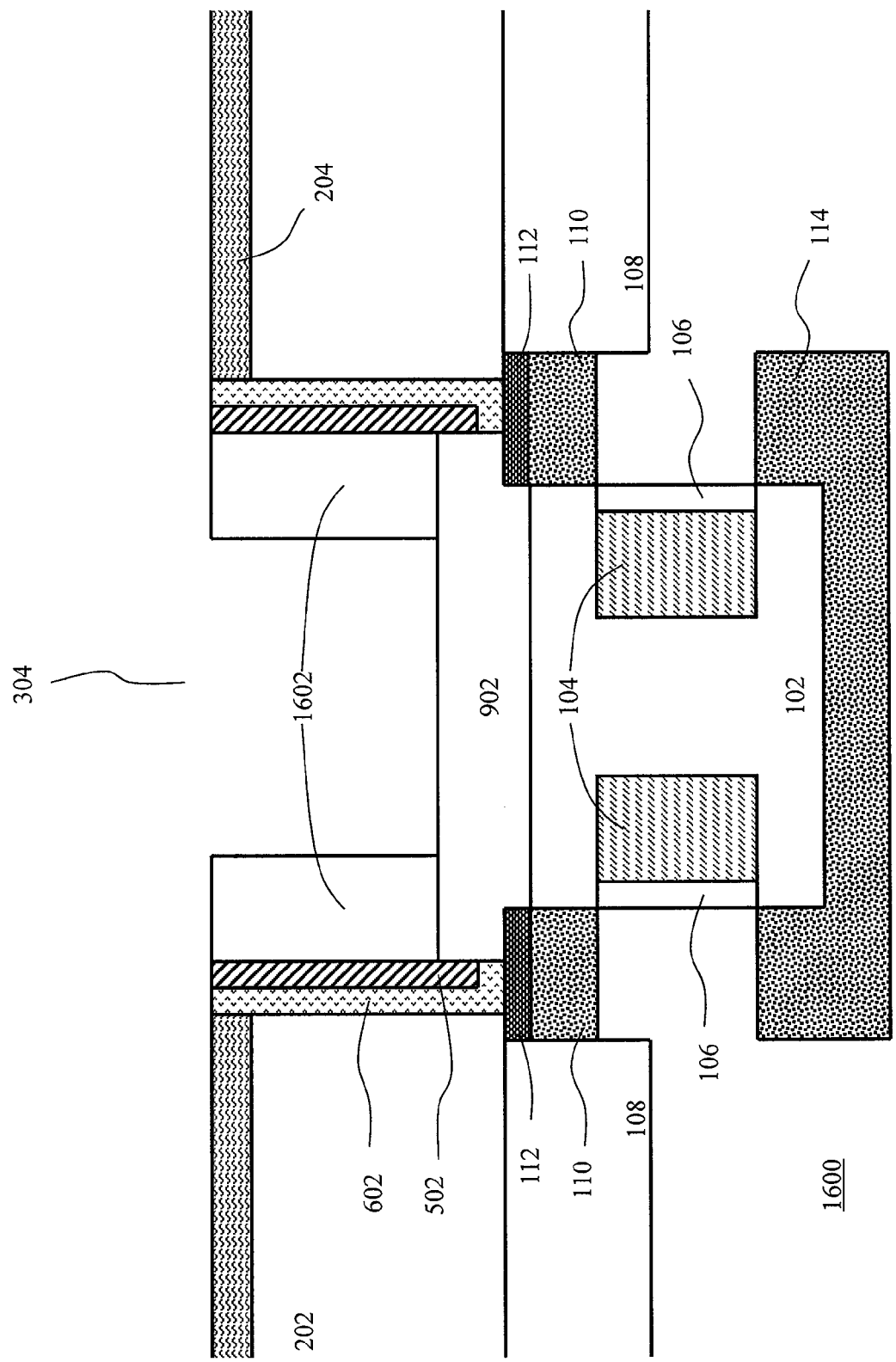
FIG. 16 is a follow-on view of the PZT spacers structure.

With reference additionally now to FIG. 16, the etching of the ferroelectric layer in the F-RAM PZT structure 1500 is illustrated, forming PZT spacers structure 1600. In FIG. 16, the PZT 1502 layer is etched away from the top of the non-erodible mask 204 and the bottom of the F-RAM opening 304, using, for example, a reactive-ion etch process, forming PZT spacers 1602 at each side of the F-RAM opening 304. The PZT spacers may have a thickness of about 400 to 2000 angstroms.

Figure 17:
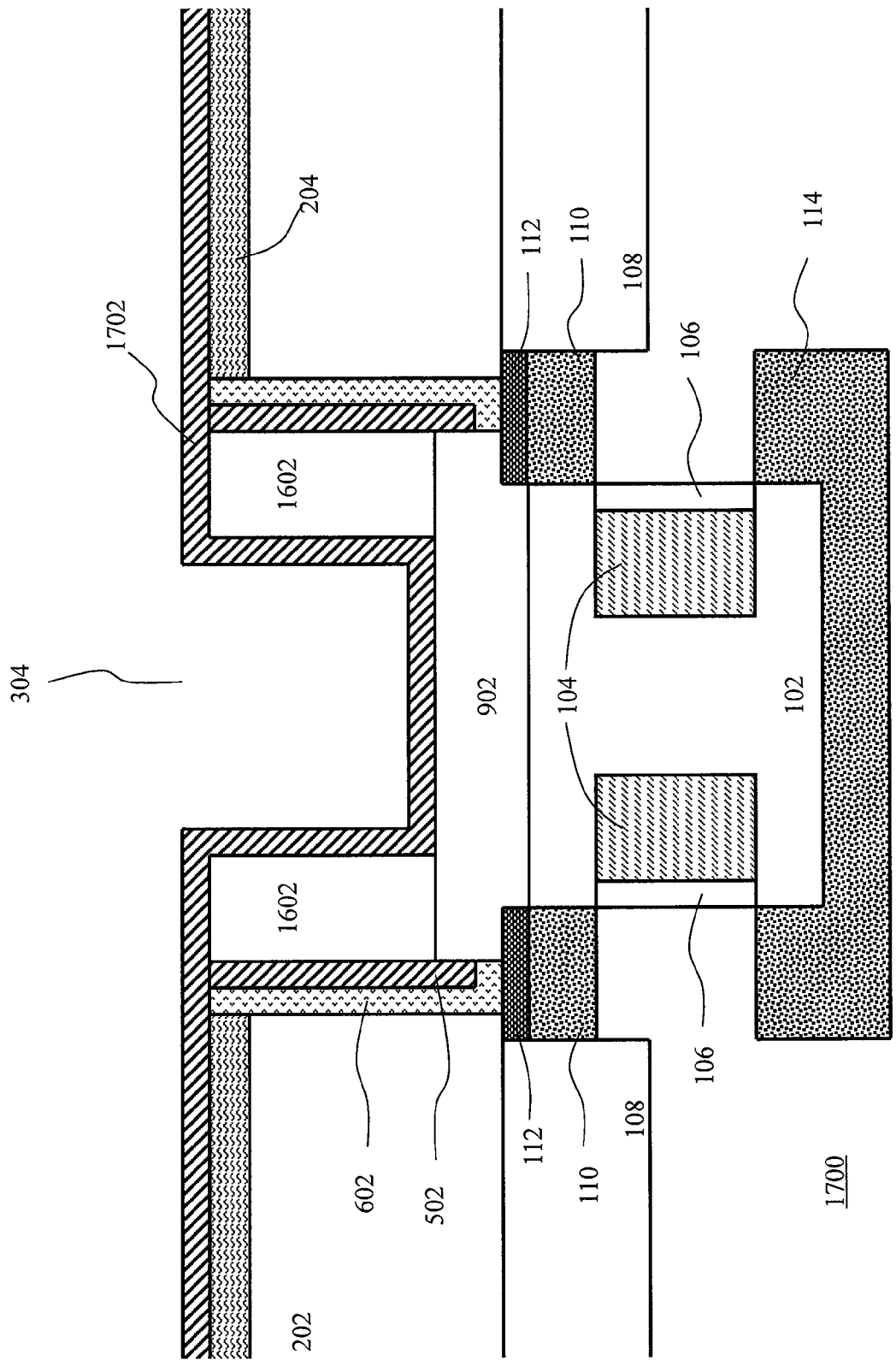
FIG. 17 is a follow-on view of the platinum TE structure.

With reference additionally now to FIG. 17, the conformal deposition of a top electrode (TE) layer over the PZT spacers structure 1600 is depicted, forming platinum TE structure 1700. In FIG. 17 a platinum 1702 top electrode (TE) conformal layer is subsequently deposited, using CVD, over the top of the PZT spacers structure 1600 to a thickness of about 500 to 1000 angstroms. Other suitable materials for the top electrode (TE) layer may include iridium (Ir) and iridium oxide (IrOx), palladium (Pd) and palladium oxide (PdOx), ruthenium (Ru) and ruthenium oxide (RuOx), rhodium (Rh) and rhodium oxide (RhOx), and other compatible noble metals.

Figure 18:
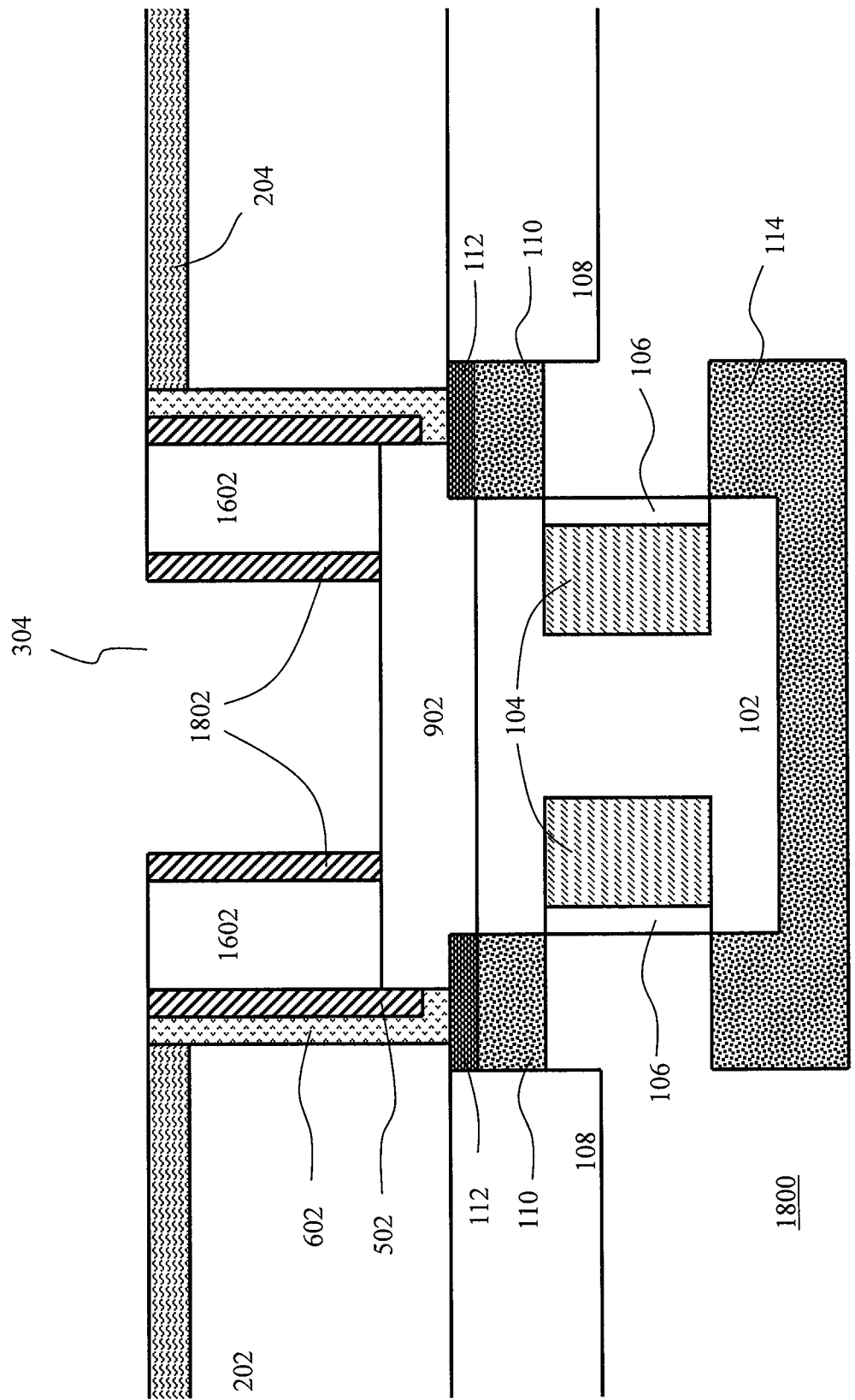
FIG. 18 is a follow-on view of the F-RAM structure with platinum TE spacers.

With reference additionally now to FIG. 18, the removal of a portion of the CVD platinum TE layer from the platinum TE structure 1700 is shown, forming an F-RAM RAM structure with platinum TE spacers 1800. In FIG. 18, the platinum 1702 TE conformal layer is etched away from the top of the non-erodible mask 204, the top of PZT spacers 1602 and the bottom of the F-RAM opening 304 with a directional reactive-ion etch, forming a set of platinum TE spacers 1802.

Figure 19:
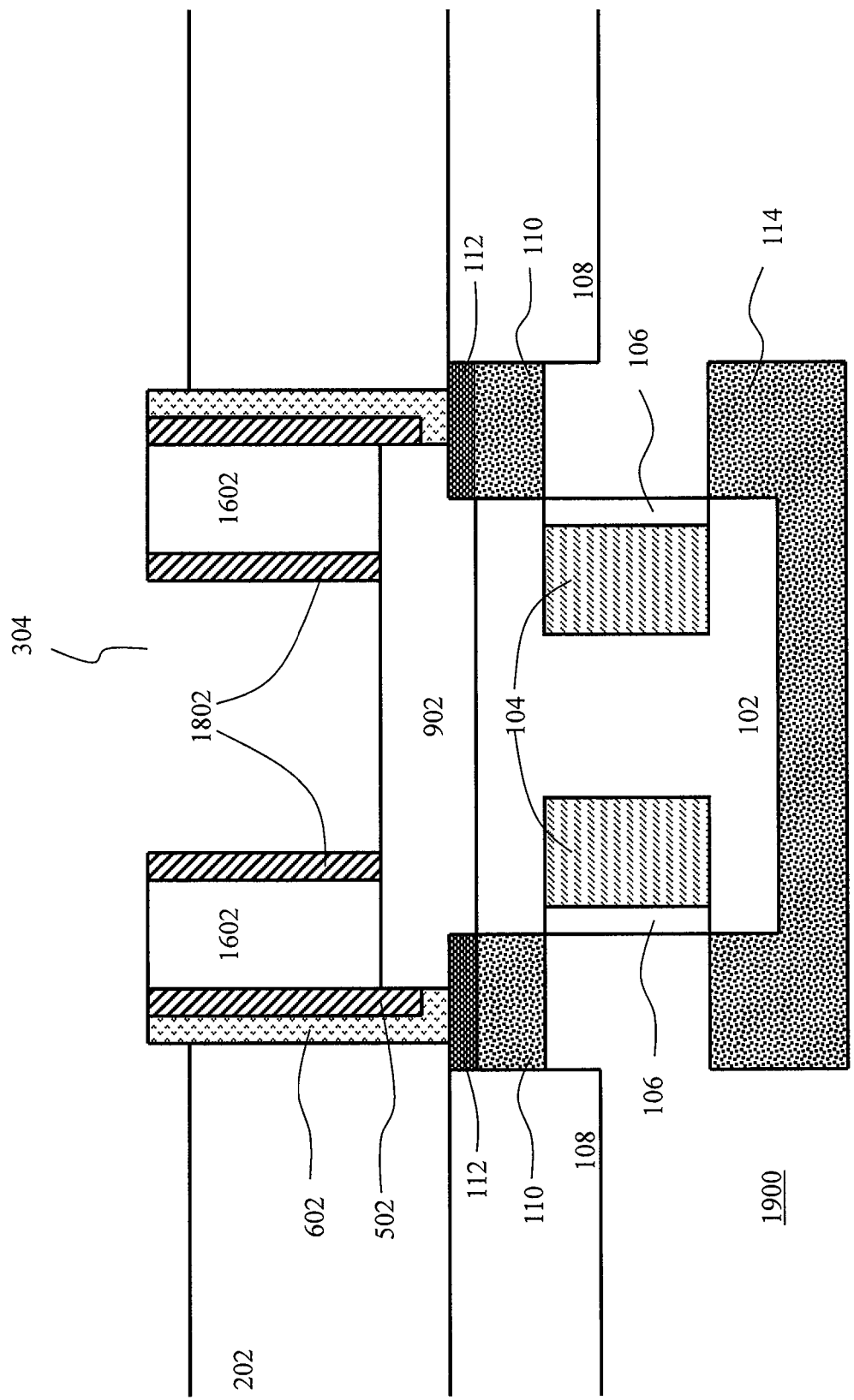
FIG. 19 is a follow-on view of the F-RAM structure without non-erodible mask.

With reference additionally now to FIG. 19, the removal of the non-erodible mask from the F-RAM structure with platinum TE spacers 1800 is illustrated, forming the F-RAM structure without non-erodible mask 1900. In FIG. 19, the non-erodible mask 204 is removed employing an ion etch chemistry, specific to the type of materials used in the non-erodible mask itself. For example, as this particular non-erodible mask is made of $Si_3N_4$, it may be etched with a $Si_3N_4$ chemistry that will not affect the oxide 202 layer, or the titanium aluminum nitride spacers 602, platinum BE spacers 502, or platinum TE spacers 1802.

Figure 20:
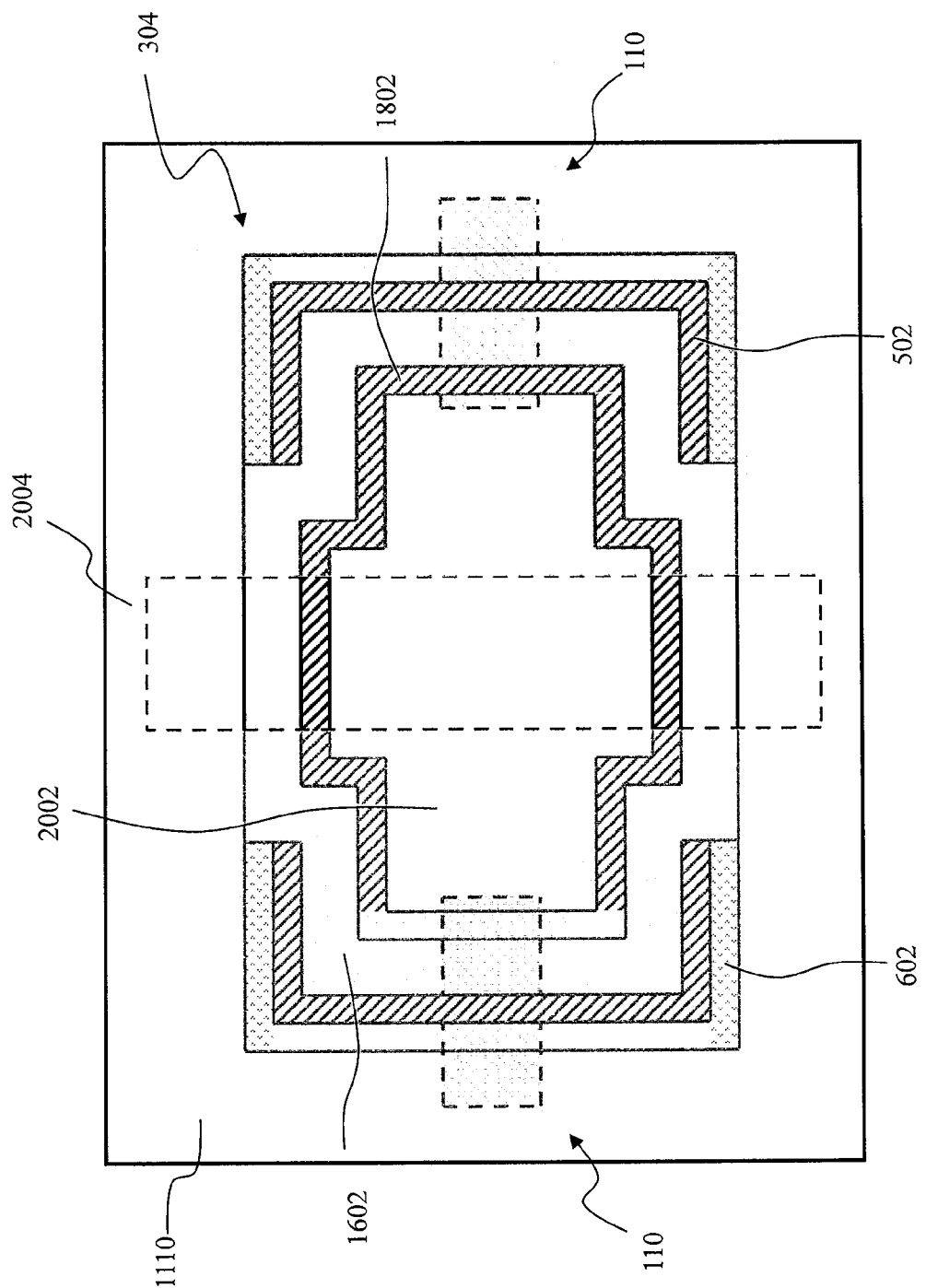
FIG. 20 is a partial, top plan view of the F-RAM opening after the formation of the PZT spacers and top electrode spacers.

With reference additionally now to FIG. 20, a top view is shown which depicts the F-RAM opening structure 2000. From a top view perspective, FIG. 20 shows the addition of the platinum TE spacers 1802 and the PZT spacers 1602 around the F-RAM opening 304. FIG. 20 also shows the deposition, on top of the F-RAM opening 304 structure, of a photoresist 2002 material that is spun applied and then imaged and photo-developed to form image opening 2004 across the F-RAM opening 304. Resist 2002 is left on the surface leaving opening 2004.

Figure 21:
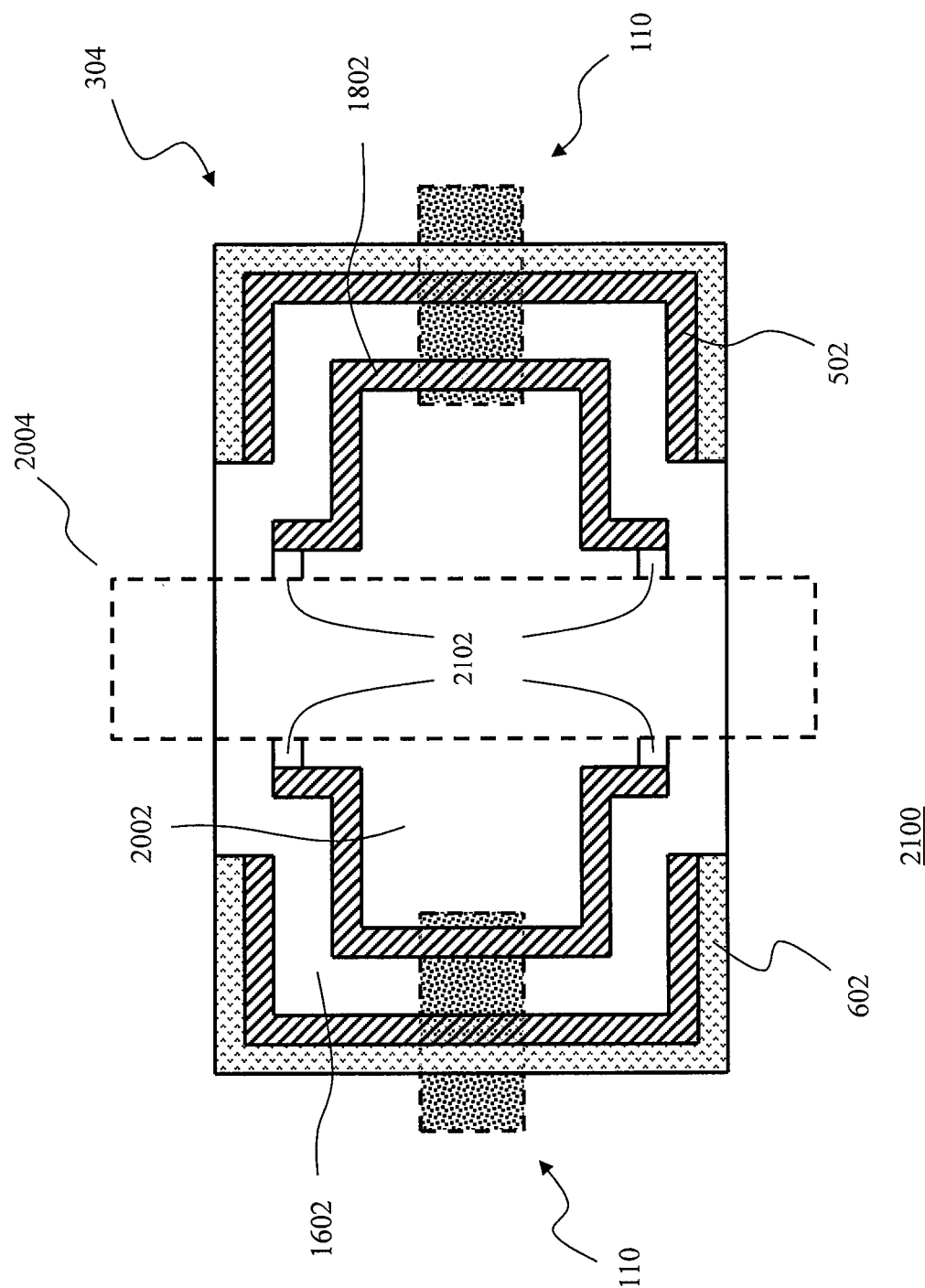
FIG. 21 is a follow-on view of the etched platinum TE spacers structure.

With reference additionally now to FIG. 21, the etching of the platinum TE spacers around the sidewalls on the F-RAM opening structure 2000 is depicted to create an etched platinum TE spacers structure 2100. In FIG. 21, using the pattern defined by the image opening 2004, a portion of the platinum TE spacers 1802 around the sidewalls of the F-RAM opening 304 is isotropically wet etched back, forming undercut regions 2102.

Figure 22:
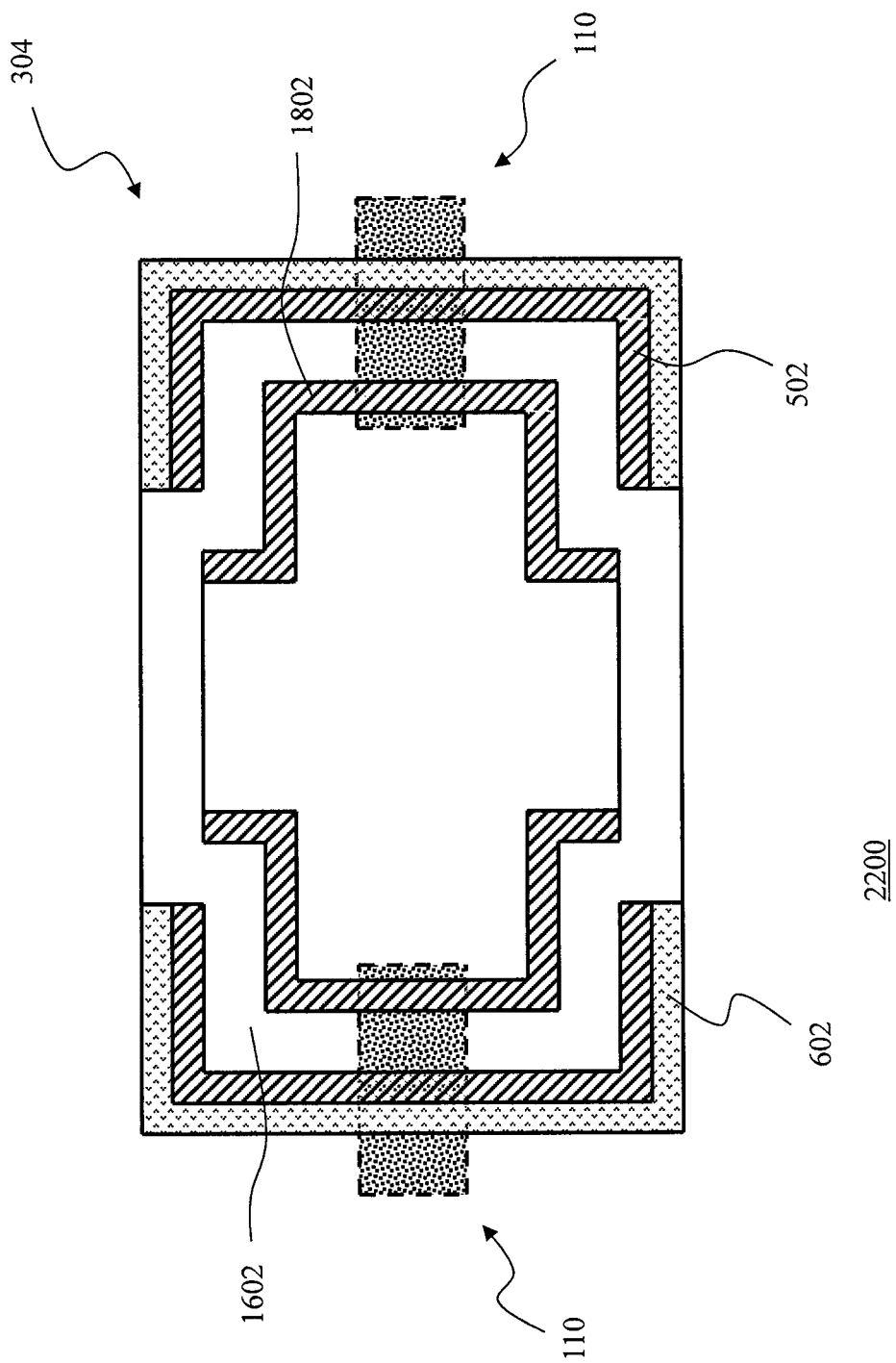
FIG. 22 is a follow-on view of the F-RAM structure after the etching of the TE spacers and removal of photoresist material.

With reference additionally now to FIG. 22, the removal of the photoresist material from the etched platinum TE spacers structure 2100 is depicted, creating F-RAM structure 2200. In FIG. 22, just the remaining photoresist 2002 material is etched away using an $O_2$ plasma etching technique and removed with a vacuum pump.

Figure 23:
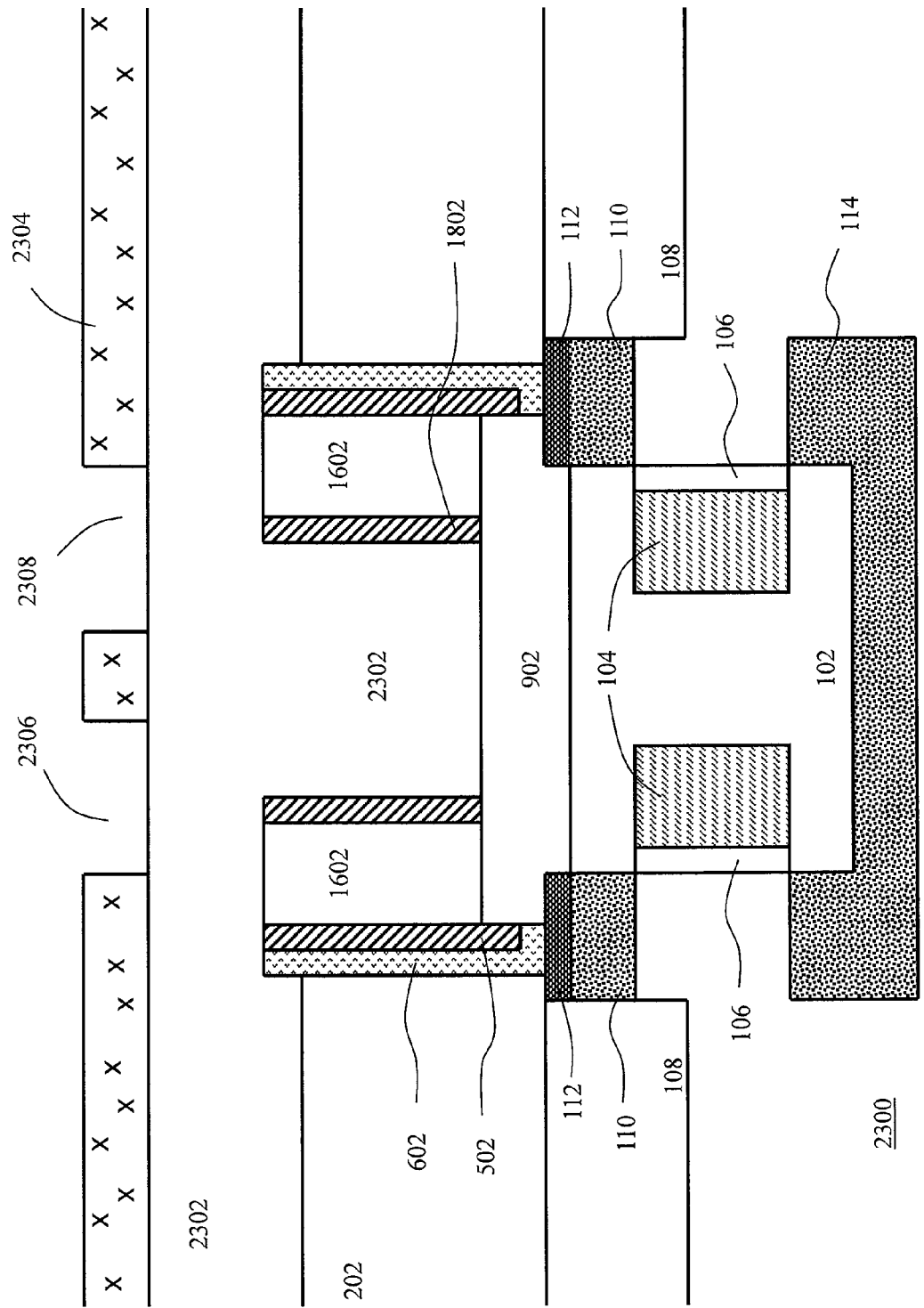
FIG. 23 is a partial, cross-sectional view of the contact photoresist mask structure.

With reference additionally now to FIG. 23, the application of a photoresist mask over the F-RAM structure 2200 is depicted, forming a contact photoresist mask structure 2300. In FIG. 23, an oxide 2302 layer is conformably deposited and planarized, using chemical mechanical polishing (CMP), on top of the oxide 202 layer, the platinum BE spacers 502, the platinum TE spacers 1802 and into the F-RAM opening 304 (not shown). A photoresist mask 2304 is subsequently defined, imaged and developed to form contact opening A 2306 and contact opening B 2308, and creating exposed regions on the oxide 2302 layer.

Figure 24:
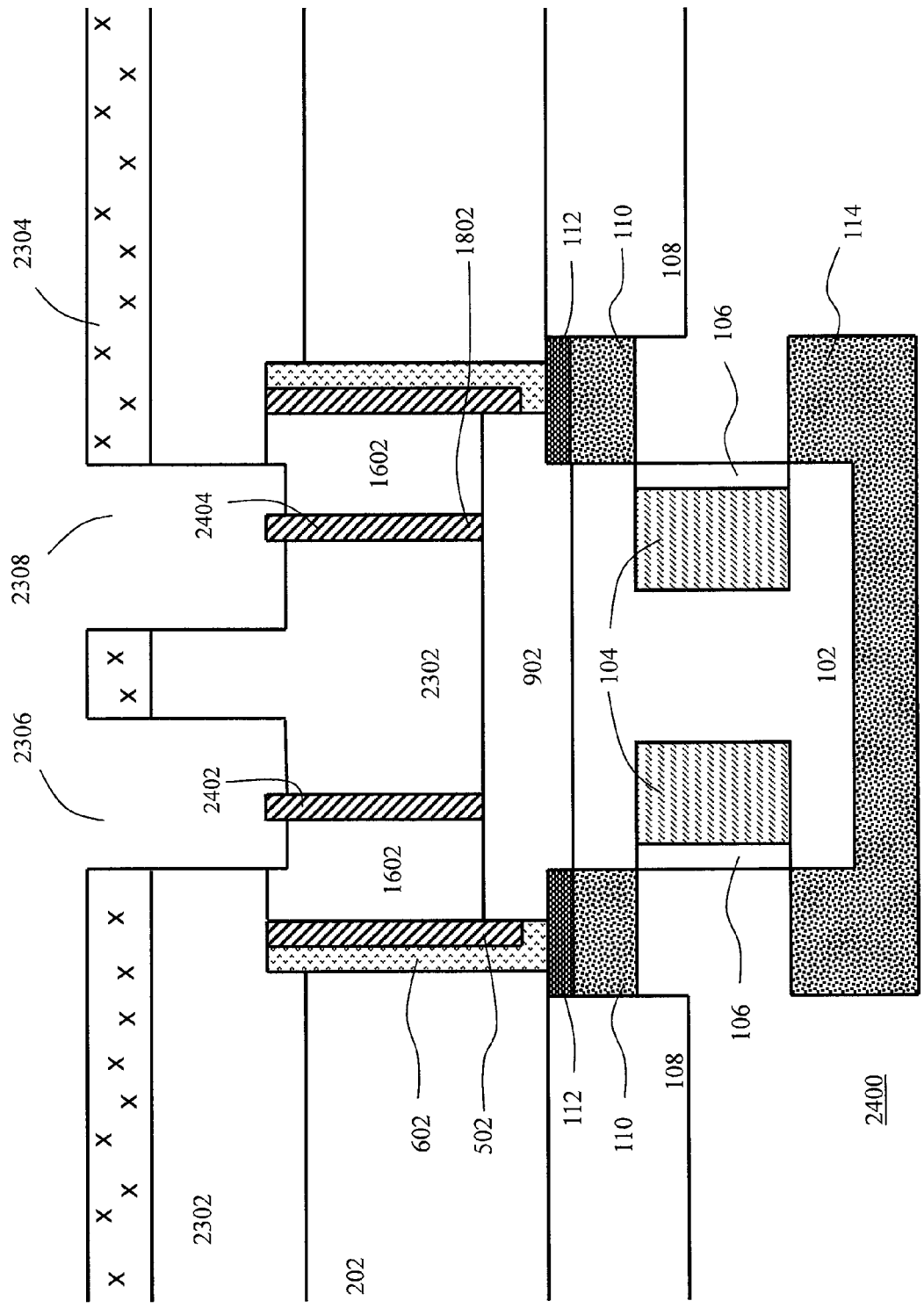
FIG. 24 is a follow-on view of the F-RAM contact opening structure.

With reference additionally now to FIG. 24, the etching of the exposed oxide in the contact photoresist mask structure 2300 is shown, creating an F-RAM contact opening structure 2400. In accordance with the photoresist mask 2304 pattern, the exposed regions of oxide 2302 layer in the contact opening A 2306 and contact opening B 2308 are etched away. This etching process continues down into a portion of the PZT spacers 1602 and the oxide 2302 layer using $CF_4$ in oxygen, creating TE contact region A 2402 (top electrode) and TE contact region B 2404 (top electrode).

Figure 25:
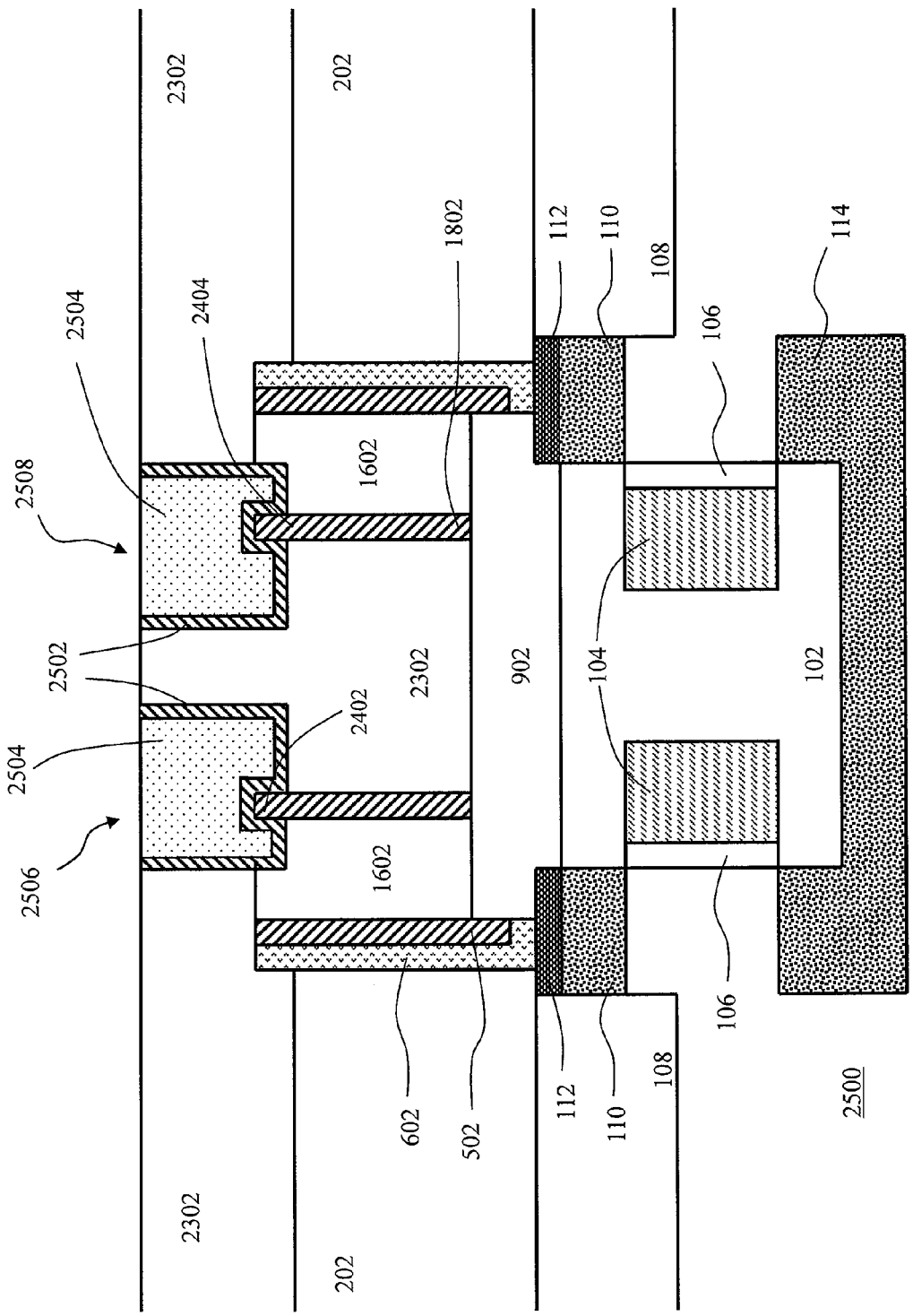
FIG. 25 is a follow-on view of the final F-RAM contact stud structure.

With reference additionally now to FIG. 25, the removal of the photoresist mask and the formation of contact studs in the F-RAM contact opening structure 2400 is shown, creating the final F-RAM contact stud structure 2500. The photoresist mask 2304 is removed from the F-RAM contact stud structure 2500 using the same $O_2$ plasma ash etching technique as used earlier. Subsequently, Ti/TiN 2502 (titanium/titanium nitride) liners are deposited into contact opening A 2306 and contact opening B 2308 (FIG. 23), followed by an application of a CVD tungsten (W) 2504 layer over the entire surface of F-RAM contact stud structure 2500, followed by a CMP process to polish back and planarize the CVD tungsten 2504 back to the level of the oxide 2302 layer.

As a result, two new contact studs (contact stud A 2506 and contact stud B 2508) are formed of Ti/TiN and CVD tungsten. Note in FIG. 25, the top electrode of a ferroelectric capacitor couples with contact stud B 2508 via TE contact region B 2404, while the top electrode of a ferroelectric capacitor couples with contact stud A 2506 through the TE contact region A 2402. Note too that the ferroelectric capacitor has independent or separated PZT spacers 1602, one for each of the bottom and top electrodes, which in terms of the structures, are isolated from each other.

Figure 26:
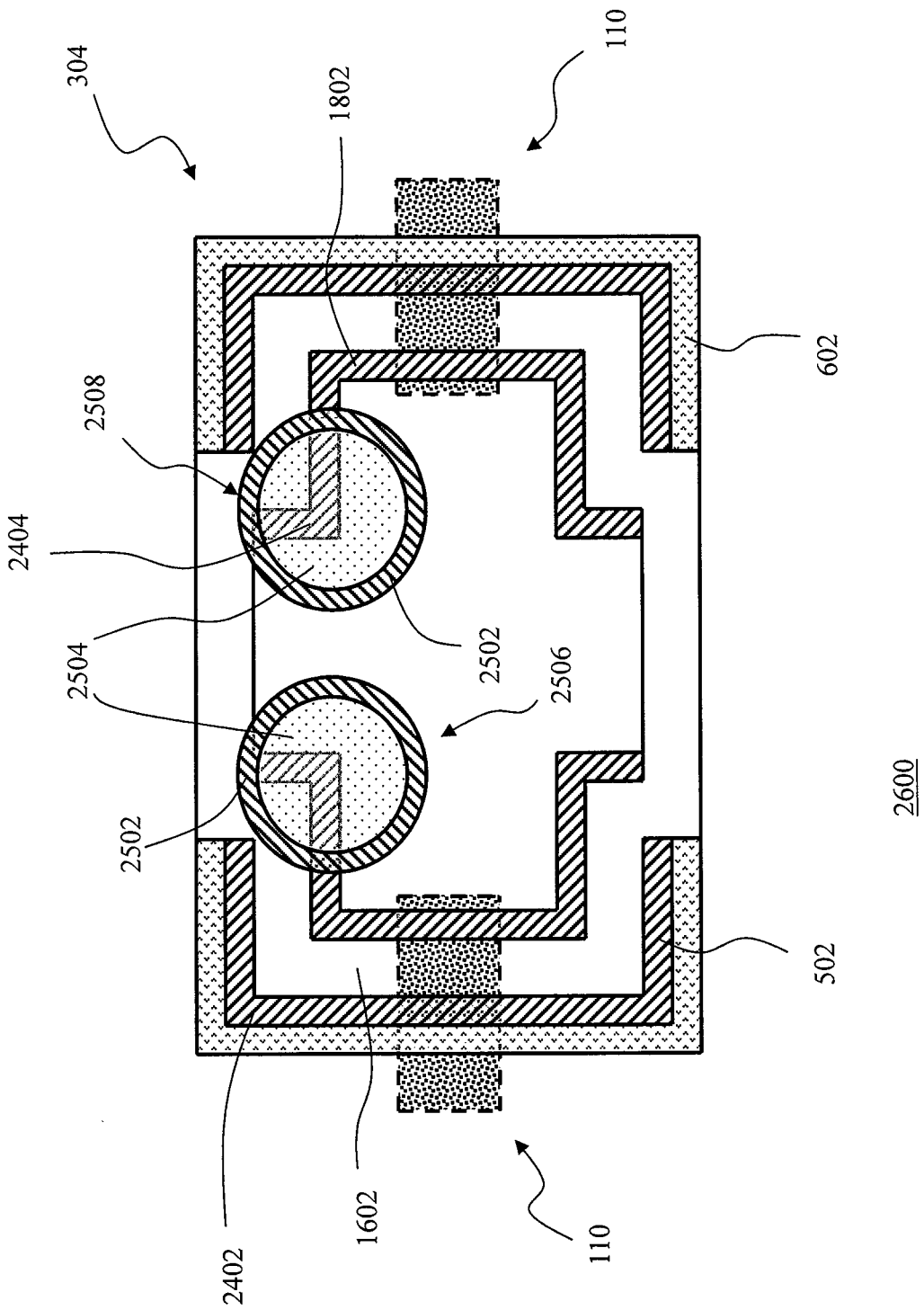
FIG. 26 is a partial, top plan view of the final F-RAM contact stud structure.

With reference additionally now to FIG. 26, a top plan view of the F-RAM final contact stud structure 2600 is shown. From a top view perspective, FIG. 26 illustrates (as circles) both contact stud A 2506 and contact stud B 2508 formed of Ti/TiN 2502 liners and filled by CVD Tungsten 2504 at both sides of the F-RAM opening 304. The TE contact region A 2402 (top electrode) couples with contact stud A 2506, while TE contact region B 2404 (top electrode) couples with contact stud B 2508.

While there have been described above the principles of the present invention in conjunction with specific processing steps and device structure, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. A method comprising:
   forming an opening in an insulating layer over a contact in a planar surface of a substrate to expose at least a portion of the contact;
   forming a self-aligned contact (SAC) electrically coupling to the contact, the SAC medially located in the opening and proximal to a sidewall thereof;
   forming an insulating cap in a lower portion of the opening, the insulating cap on an exposed portion of the contact;
   forming a ferroelectric spacer in the opening medially of the SAC and on said insulating cap; and
   forming a top electrode spacer in the opening medially of the ferroelectric spacer and on said insulating cap.

2. The method of claim 1 wherein forming the opening comprises selectively removing a portion of the insulating layer and a selected region of the planar surface, and wherein forming the insulating cap comprises filling the selected region of the planar surface.

3. The method of claim 1 wherein forming the SAC comprises:
   forming a conductive spacer to the contact laterally of the opening; and
   forming a bottom electrode spacer medially of the conductive spacer within the opening.

4. The method of claim 1 wherein forming the SAC comprises:
   depositing a conductive layer in the opening to conform to sidewalls and a lower surface of the opening;
   depositing a bottom electrode layer over the conductive layer; and
   etching the bottom electrode layer and the conformal conductive layer to form the conductive spacer electrically coupling to the contact laterally of the opening and the bottom electrode spacer medially of the conductive spacer.

5. The method of claim 4 wherein etching the bottom electrode layer and the conformal conductive layer comprises anisotropically etching the bottom electrode layer and the conformal conductive layer using reactive ion etching (RIE).

6. A method comprising:
   forming a transistor structure including a contact in a planar surface of a substrate; and
   forming a ferroelectric capacitor overlying the transistor structure, the method of forming the ferroelectric capacitor comprising:
      forming an insulating layer over the contact;
      forming an opening in the insulating layer to expose at least a portion of the contact, wherein forming the opening further comprises removing a selected region of the planar surface;
      forming a bottom electrode spacer electrically coupling to the contact, the bottom electrode spacer medially located in the opening and proximal to a sidewall thereof;
      forming an insulating cap in a lower portion of the opening, wherein forming the insulating cap comprises filling the selected region of the planar surface and covering exposed portions of the contact;
      forming a ferroelectric spacer in the opening on the insulating cap and medially of the bottom electrode spacer; and
      forming a top electrode spacer in the opening on the insulating cap and medially of the ferroelectric spacer.

7. The method of claim 6 wherein forming the opening comprises selectively removing a portion of the insulating layer and a selected region of the planar surface.

8. The method of claim 6 wherein forming the transistor structure comprises a three dimensional (3-D) transistor structure including a contact in a planar surface of a substrate.

9. A method comprising:
   forming an insulating layer overlying a transistor structure formed in a planar surface of a substrate;
   selectively removing a portion of the insulating layer and a selected region of the planar surface beneath the portion to form an opening exposing a contact to the transistor structure;
   forming a bottom electrode spacer proximal to a sidewall of the opening and electrically coupling to the contact;
   forming an insulating cap in a lower portion of the opening, the insulating cap filling the selected region of the planar surface and covering exposed portions of the contact;
   forming a ferroelectric spacer in the opening over the insulating cap and medially of the bottom electrode spacer; and
   forming a top electrode spacer in the opening over the insulating cap and medially of the ferroelectric spacer.

10. The method of claim 9, wherein forming the bottom electrode spacer comprises:
    forming a conductive spacer to the contact laterally of the opening; and
    forming the bottom electrode spacer medially of the conductive spacer within the opening.

11. The method of claim 10, wherein forming the bottom electrode spacer electrically coupling to the contact comprises:
    depositing a conductive layer in the opening to conform to sidewalls and a lower surface of the opening;
    depositing a bottom electrode layer over the conductive layer; and
    etching the bottom electrode layer and the conformal conductive layer to form the conductive spacer electrically coupling to the contact laterally of the opening and the bottom electrode spacer medially of the conductive spacer.

12. The method of claim 11 wherein etching the bottom electrode layer and the conformal conductive layer comprises anisotropically etching the bottom electrode layer and the conformal conductive layer using reactive ion etching.

13. The method of claim 11 wherein the conductive layer comprises titanium aluminum nitride.

14. The method of claim 11 wherein a bottom electrode layer comprises at least one of Pt, Ir, IrOx, Pd, PdOx, Ru, RuOx, Rh, RhOx or other noble metal.

15. The method of claim 9, wherein forming the insulating cap in the lower portion of the opening comprises filling the selected region of the planar surface with an insulating material.

16. The method of claim 15, wherein forming the insulating cap in the lower portion of the opening comprises depositing insulating material on the exposed contact.

17. The method of claim 9, wherein the ferroelectric spacer comprises at least one of PZT, PLZT, BST, SBT or STO.

18. The method of claim 9 wherein the insulating cap comprises an oxide layer.

19. The method of claim 1 wherein the insulating cap comprises an oxide layer.

20. The method of claim 6 wherein the insulating cap comprises an oxide layer.

\* \* \* \* \*